United States Patent [19]
Nitta et al.

[11] Patent Number: 5,901,166
[45] Date of Patent: May 4, 1999

[54] OSCILLATION POLARIZATION MODE SELECTIVE SEMICONDUCTOR LASER, LIGHT TRANSMITTER AND OPTICAL COMMUNICATION SYSTEM USING THE LASER

[75] Inventors: Jun Nitta, Tokyo; Yuichi Handa, Atsugi, both of Japan

[73] Assignee: Canon Kabushiki Kaisha, Tokyo, Japan

[21] Appl. No.: 08/972,728

[22] Filed: Nov. 18, 1997

Related U.S. Application Data

[63] Continuation of application No. 08/387,190, Feb. 13, 1995, abandoned.

[30] Foreign Application Priority Data

| Feb. 18, 1994 | [JP] | Japan | 6-045196 |
| Feb. 23, 1994 | [JP] | Japan | 6-051205 |
| Dec. 17, 1994 | [JP] | Japan | 6-334067 |

[51] Int. Cl.$^6$ .................................... H01S 3/18
[52] U.S. Cl. .................. 372/50; 372/45; 372/27
[58] Field of Search .................. 372/50, 45, 27

[56] References Cited

U.S. PATENT DOCUMENTS

| 4,775,980 | 10/1988 | Cinone et al. . | |
| 4,887,255 | 12/1989 | Handa et al. . | |
| 4,918,701 | 4/1990 | Amann et al. . | |
| 4,935,930 | 6/1990 | Handa . | |
| 5,396,508 | 3/1995 | Bour et al. | 372/45 |
| 5,502,741 | 3/1996 | Carroll et al. | 372/50 |
| 5,586,131 | 12/1996 | Ono et al. | 372/27 |

FOREIGN PATENT DOCUMENTS

| 0332446 | 9/1989 | European Pat. Off. | H01S 3/103 |
| 0361035 | 4/1990 | European Pat. Off. . | |
| 0463569A3 | 1/1992 | European Pat. Off. | H01S 3/19 |
| 9214174 | 8/1992 | European Pat. Off. . | |
| 1055889 | 3/1989 | Japan | H01S 3/18 |
| 02159781 | 6/1990 | Japan . | |
| 2159781 | 6/1990 | Japan | H01S 3/18 |

OTHER PUBLICATIONS

"Polarization switching and bistability in an external cavity laser with a polarization–sensitive saturable absorber" by Y. Ozeki et al.; Applied Physics Letters; vol. 58 vol. 20, May 20, 1991, New York, N.Y. pp. 2214–2216.

"Highly efficient TE/TM mode switching of GaAsP/AlGaAs strained quantum–well laser diodes" by H. Tanaka et al. Appl. Phys. Lett. 64 (2) Jan. 1994, pp. 158–160.

"Polarization switching in In GaAsP/InP distributed–feedback lasers with a strained active layer" by A.I. Guriev et al.; Soviet Technical Physics Letters, vol. 19, No. 12, Dec. 1993, New York, N.Y. pp. 741–743.

"1.5 $\mu$ Multiquantum–Well Semiconductor Optical Amplifier With Tensile and Compressively Strained Wells for Polarization–Independent Gain" by M.A. Newkirk et al. IEEE Photonics Technology Letters. vol. 5, No. 4, Apr. 1993, New York, N.Y., pp. 405–408.

*Primary Examiner*—Rodney Bovernick
*Assistant Examiner*—Yisun Song
*Attorney, Agent, or Firm*—Fitzpatrick, Cella, Harper & Scinto

[57] ABSTRACT

A semiconductor laser that selectively performs oscillations in different polarization modes has first and second laser regions on a substrate. The first laser region exhibits a gain spectrum in which one polarization mode is dominant and the second laser region exhibits a gain spectrum in which a different polarization mode is dominant. Current injected independently into the each laser region causes polarization mode oscillation competition. One of the different polarization mode oscillations is selected by, for example, injecting a minute modulated current into at least one of the first and second laser regions.

13 Claims, 25 Drawing Sheets

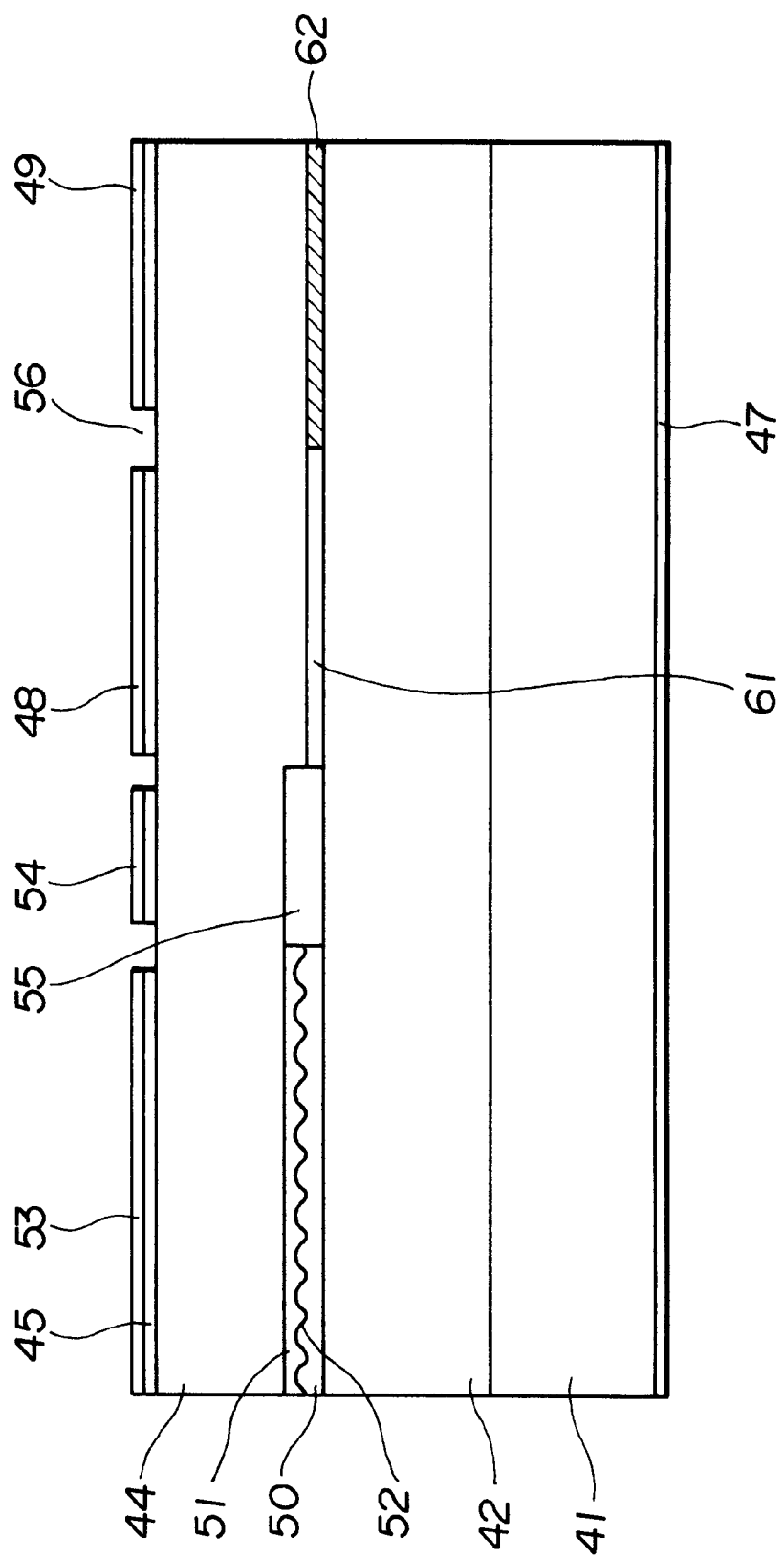

OSCILLATION POLARIZATION MODE SELECTIVE SEMICONDUCTOR LASER, LIGHT TRANSMITTER AND OPTICAL COMMUNICATION SYSTEM USING THE LASER

This application is a continuation of application Ser. No. 08/387,190 filed Feb. 13, 1995 now abandoned.

BACKGROUND OF THE INVENTION

1. Field of the Invention

The present invention relates to a semiconductor laser whose oscillation polarization mode can be changed by an external control and which is suitable for use as a light source apparatus in the field of optical communications, for example. The present invention further relates to an optical communication system and a light transmitter which use the above-mentioned semiconductor laser, respectively.

2. Related Background Art

As a conventional device, Japanese Patent Application Laid-Open No. 2(Heisei)-159781 discloses a distributed feedback (DFB) laser whose oscillation polarization mode can be changed by an external control. In this DFB laser, carrier injection for phase adjustment and formation of population inversion causes a change in the phase of internal light, and the oscillation occurs in either of transverse electric (TE) and transverse magnetic (TM) modes whose threshold gain is lower.

In the above-discussed device, however, the oscillation polarization mode of the device output is changed by controlling the phases of light in TE and TM modes. Therefore, a predetermined amount of current always needs to be injected into the device to form population inversion. Further, in the prior art device, an active layer is formed with a bulk material, and hence a difference in gain between TE and TM modes is small. However, if an active layer having a quantum well structure is used, the difference in gain between TE and TM modes becomes large. As a result, a wavelength range, in which the polarization mode of oscillated light can be changed by the same operation principle as the bulk material case, is narrowed, and the fabrication precision needed for formation of a grating and the like is strict. Here, the pitch of the grating determines Bragg wavelengths for TE and TM modes which are respectively oscillation wavelengths of light in TE and TM modes.

Furthermore, the prior art device is not provided with an effective and positive means for enabing the oscillation polarization mode switching. Therefore, it is difficult to obtain a highly reproducible polarization mode selective laser.

SUMMARY OF THE INVENTION

It is an object of the present invention to provide an oscillation polarization mode selective semiconductor laser whose oscillation polarization mode can be changed by injected current or applied voltage control and which solves the above problem, a driving method of this semiconductor laser, a light transmitter or transceiver including this semiconductor laser and an optical communication system using this semiconductor laser.

The invention is directed to a semiconductor laser having plural laser regions in which one of different oscillation polarization modes is selected. One laser region has a gain spectrum wherein one polarization mode is dominant and another laser region has a gain spectrum wherein another polarization mode is dominant. The laser regions are coupled to one another and current is independently injected into the laser regions to cause mode competition between the different polarization mode oscillations.

According to one aspect of the present invention, there is provided an oscillation polarization mode selective semiconductor laser for selectively performing one of different polarization mode oscillations, which includes a subtrate, a first laser region having a semiconductor laser structure which has a characteristic that a gain spectrum of one of the different polarization modes is dominant, a second laser region having a semiconductor laser structure which has a characteristic that a gain spectrum of the other of the different polarization modes is dominant, a coupling unit for coupling the first laser region to the second laser region, and an injecting unit for independently injecting currents into the first laser region and the second laser region to cause a mode competitive state between oscillations in the different polarization modes. In the mode competitive state, one of the oscillations in the different polarization modes can be selectively caused to emit light in a selected polarization mode, by injecting a minute modulated current into at least one of the first and second laser regions or a selecting unit which is separately provided from the injecting unit, or applying a minute modulated voltage to the selecting unit, for example.

According to another aspect of the present invention, there is provided a driving method for driving the oscillation polarization mode selective semiconductor laser described immediately above, which includes a step of injecting a modulated current, which has a modulation frequency, into one of the first laser region and the second laser region, and a step of injecting a direct current, which has a constant intensity, into the other of the the first laser region and the second laser region.

According to still another aspect of the present invention, there is provided a driving method for driving the oscillation polarization mode selective semiconductor laser described immediately above, which includes a step of injecting a first modulated current, which a modulation frequency, into one of the first laser region and the second laser region, and a step of injecting a second modulated current, which has a modulation frequency in anti-phase with that of the first modulated current, into the other of the first laser region and the second laser region.

According to yet another aspect of the present invention, there is provided a driving method for driving the oscillation polarization mode selective semiconductor laser described above, which includes a step of injecting a first constant current, which is below a threshold current, into one of the first laser region and the second laser region, a step of injecting a second constant current, which is below a threshold current, into the other of the first laser region and the second laser region, and a step of imparting one of a minute modulated current and a minute modulated voltage to the selecting unit.

According to yet another aspect of the present invention, there is provided a light transmitter which includes the oscillation polarization mode selective semiconductor laser described above, a control unit for modulating output light of the semiconductor laser in its polarization mode in accordance with an input signal supplied to the control unit, and a polarization mode selective unit for transmitting therethrough only light in one of the different polarization modes from the semiconductor laser.

According to yet another aspect of the present invention, there is provided an optical communication system which includes the light transmitter described immediately above, a transmission unit for transmitting the light selected by the polarization mode selective unit, and a receiver for receiving the light transmitted by the transmission unit.

These advantages and others will be more readily understood in connection with the following detailed description of the preferred embodiments in conjunction with the drawings.

BRIEF DESCRIPTION OF THE DRAWINGS

FIG. 7 is a cross sectional view illustrating a second embodiment of a semiconductor laser constructed in accordance with this invention.

DESCRIPTION OF THE PREFERRED EMBODIMENTS

First Embodiment

Figure 1:
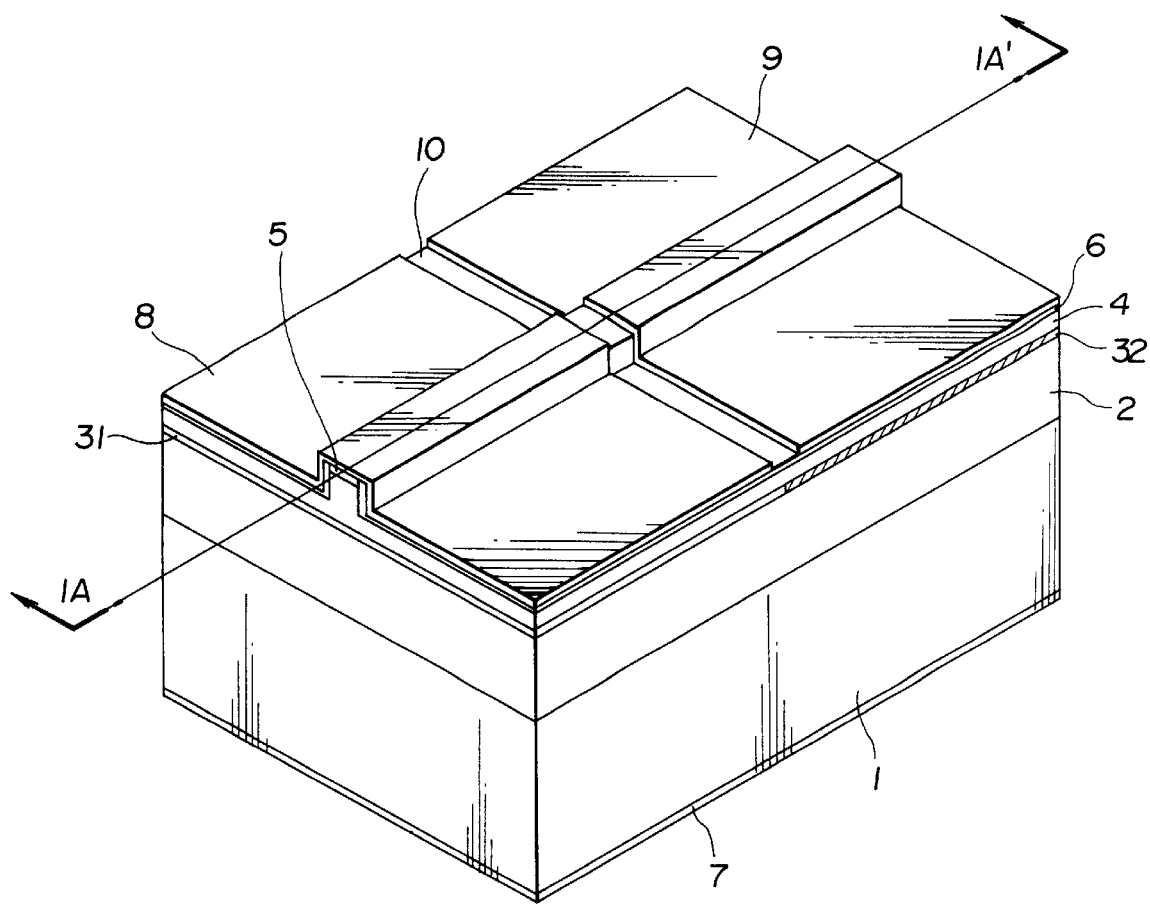
FIG. 1 is a perspective view illustrating the schematic structure of a first embodiment of a semiconductor laser constructed in accordance with this invention.
Figure 2:
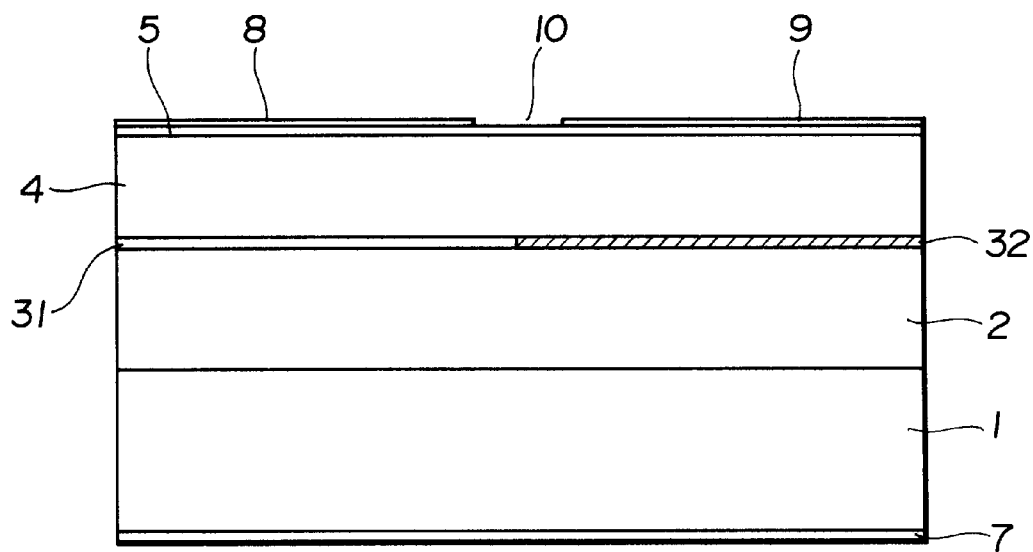
FIG. 2 is a 1A-1A' cross sectional view of FIG. 1.

A first embodiment of the present invention will be described with reference to FIGS. 1 and 2 which illustrate a semiconductor laser having a Fabry-Perot cavity constructed in accordance with the present invention. In FIGS. 1 and 2, reference numeral 1 is a n-type GaAs substrate. Reference numeral 2 is an n-type $Al_{0.5}Ga_{0.5}As$ first clad layer. Reference numeral 31 is a first active layer which has a larger gain for TE mode light. Reference numeral 32 is a second active layer which has a larger gain for TM mode light. Reference numeral 4 is a p-type $Al_{0.5}Ga_{0.5}As$ second clad layer. Reference numeral 5 is a p-type GaAs cap layer. Reference numeral 6 is an insulating layer. Reference numeral 7 is a first electrode of an alloy of Au and Ge formed on the bottom surface of the substrate 1, reference numeral 8 is a second electrode of an alloy of Au and Cr formed for injecting a current into the first active layer 31, and reference numeral 9 is a third electrode of an alloy of Au and Cr formed for injecting a current into the second active layer 32. Reference numeral 10 is a separation groove for electrically separating the second electrode 8 from the third electrode 9.

Figure 3:
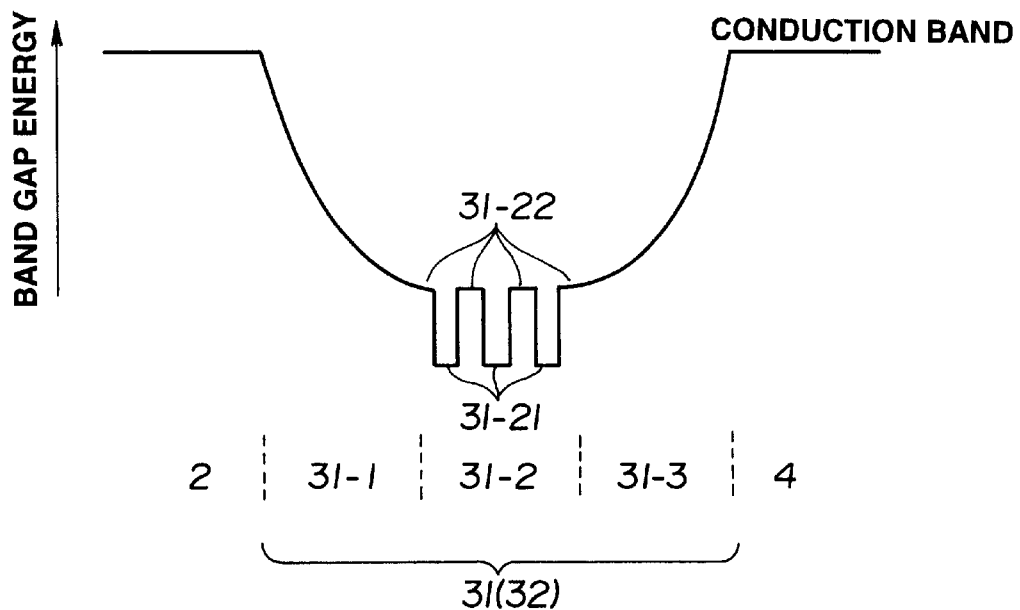
FIG. 3 illustrates the energy band structure of an active layer of the first embodiment.

FIG. 3 illustrates bandgaps of the first active layer 31 and the second active layer 32, using only energy levels in the conduction band. The bandgaps of the first clad layer 2 and the second clad layer 4 are also illustrated. The first active layer 31 is comprised of layers 31-1, 31-2 and 31-3. The layer 31-2 consists of alternated well layers 31-21 and barrier layers 31-22. The layer 31-1 is a graded index (GRIN) layer whose refractive index or energy bandgap varies from that of $Al_{0.5}Ga_{0.5}As$ to that of $Al_{0.3}Ga_{0.7}As$, while the layer 31-3 is a GRIN layer whose index or energy gap varies from that of $Al_{0.3}Ga_{0.7}As$ to that of $Al_{0.5}Ga_{0.5}As$. The layer 31-2 is an active region having a quantum well structure. The well layer 31-21 is formed with, for example, GaAs, and the barrier layer 31-22 is formed with, for example, $Al_{0.3}Ga_{0.7}As$. On the other hand, the second active layer 32 has a little different structure from the first active layer 31. The well layer 31-21 of the second active layer 32 is formed with, for example, $GaAl_{0.8}P_{0.2}$, and thus the well layer 31-21 is a so-called tensile strain quantum well. Accordingly, the first active layer 31 has a larger gain for TE light, and the second active layer 32 has a larger gain for TM light.

In the first embodiment, a ridge waveguide structure as shown in FIG. 1 is employed for a transverse or lateral confinement structure of the waveguide. Other lateral confinement structures used in a conventional semiconductor laser, such as a burying structure, may be used, in place of the ridge structure.

Further, in the first embodiment, the structure for simply dividing the electrode into two portions is used for separating the two electrodes 8 and 9 from each other. Other structures, such as a deeply etched slit, may be used, instead of the separation groove 10.

Figure 4:
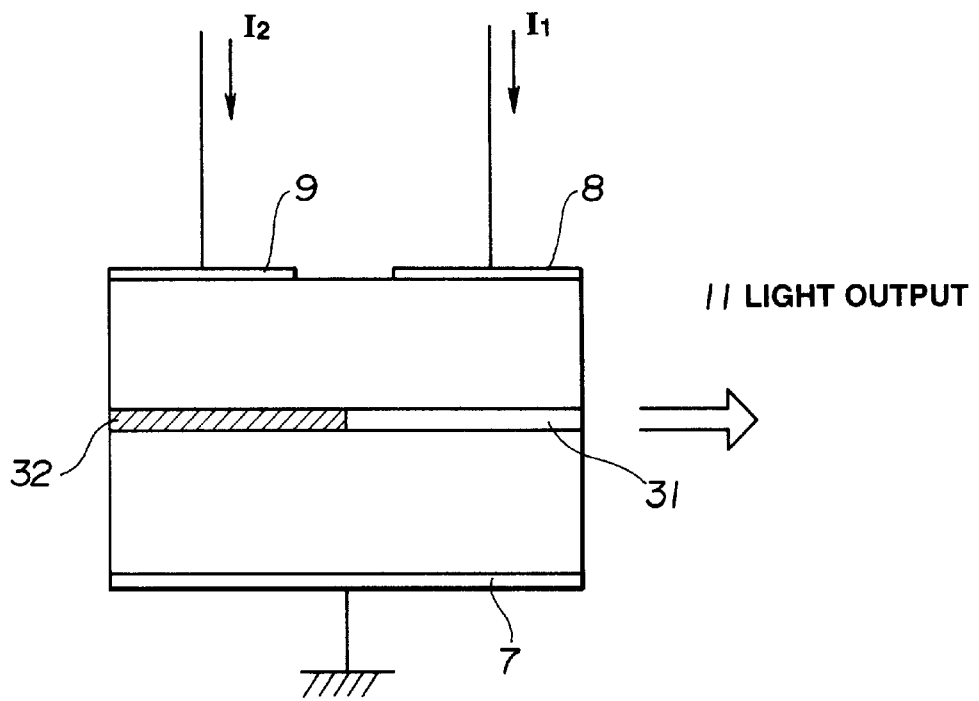
FIG. 4 is a cross sectional view illustrating a driving method of the first embodiment.
Figure 5A:
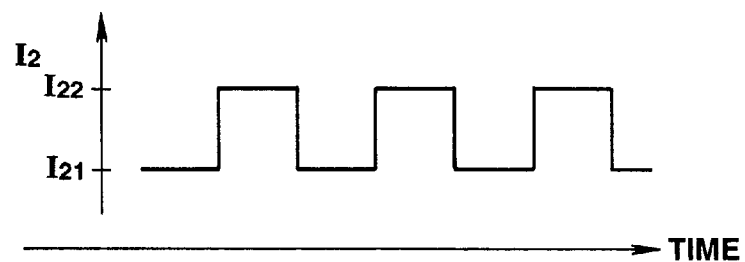
FIGS. 5A–5D are graphs illustrating the driving method of the first embodiment and light outputs of the first embodiment.
Figure 5B:
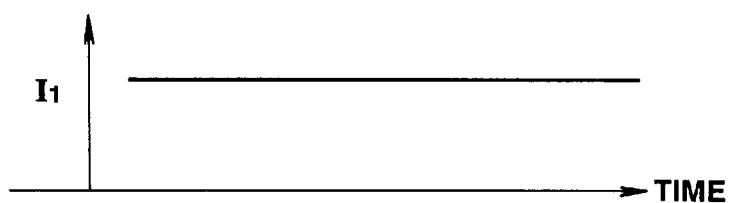
Figure 5C:
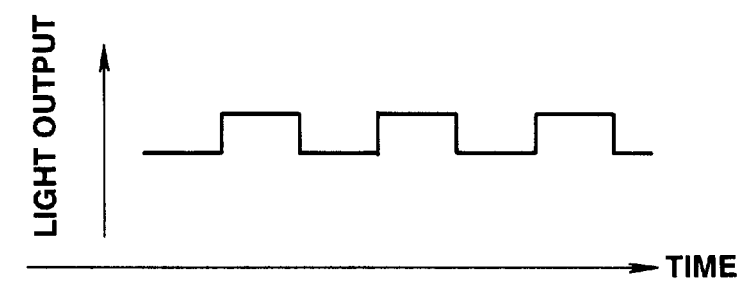
Figure 5D:
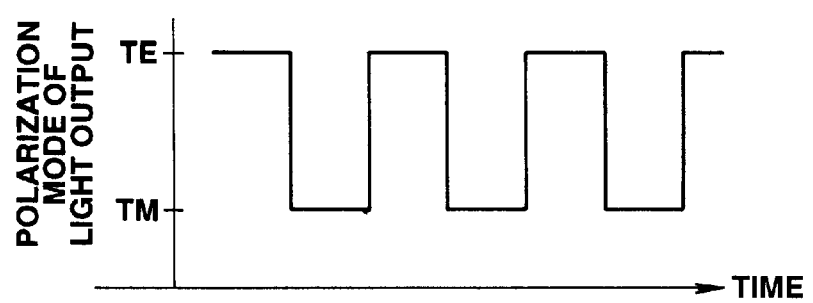

A laser driving method of this embodiment will be described with reference to FIGS. 4 and 5A–5D. In FIG. 4, $I_1$ is a current injected into the first active layer 31, and $I_2$ is a current injected into the second active layer 32. Reference numeral 11 is a light output. FIGS. 5A and 5B illustrate a method for injecting current into this device. The injection current $I_1$ and the injection current $I_{21}$, which is a bias amount of the current $I_2$, are set such that the oscillation light from the semiconductor laser of this embodiment is in TE mode. An injection current $I_{22}$, which is a modulation amount of the current $I_2$, is set such that the oscillation light from the semiconductor laser of this embodiment is in TM mode. The light output 11 as illustrated in FIG. 5C can be obtained by such a driving method. The oscillation polarization mode of the light output 11 is switched between TE and TM modes, as illustrated in FIG. 5D.

In more detail, when currents respectively injected into the first active layer 31 and the second active layer 32 are $I_1$ and $I_{21}$, a given wavelength of a longitudinal mode satisfies the oscillation condition only in TE mode, leading to the oscillation in TE mode. On the other hand, when currents respectively injected into the first active layer 31 and the second active layer 32 are $I_1$ and $I_{22}$, a given wavelength of a longitudinal mode satisfies the oscillation condition only in TM mode, leading to the oscillation in TM mode.

Figure 6A:
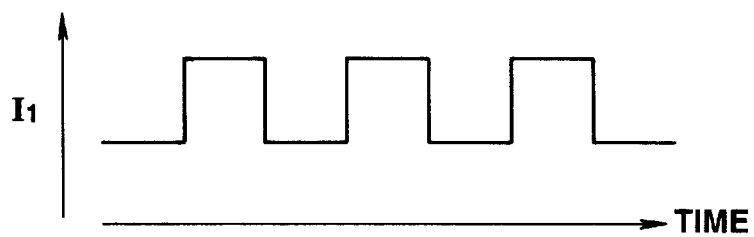
FIGS. 6A–6D are graphs illustrating another driving method of the first embodiment and light outputs of the first embodiment.
Figure 6B:
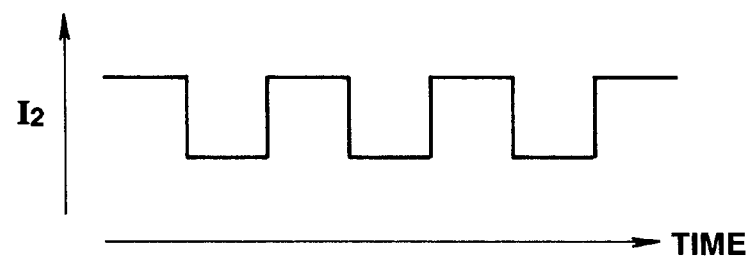
Figure 6C:
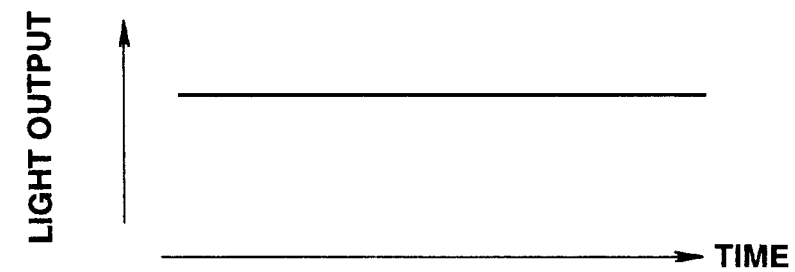
Figure 6D:
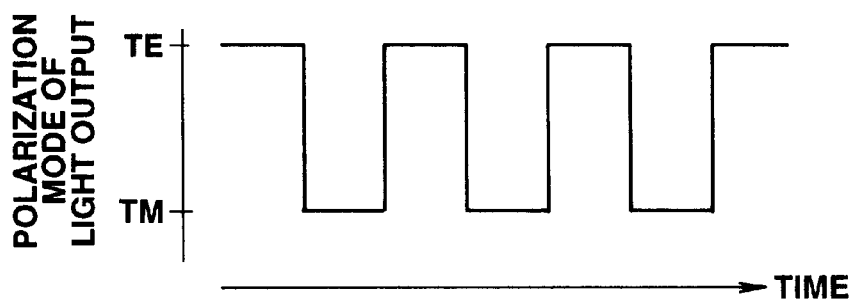

FIGS. 6A and 6B illustrate a further current injection method of this device. In the driving method described referring to FIGS. 5A–5D, the light output 11 (see FIG. 5C) fluctuates by the switch-over between TE and TM modes, depending on the relationship between the injection current and the threshold gain. In the driving method of FIGS. 6A–6D, the currents $I_1$ and $I_2$ are modulated in opposite phases to each other (see FIGS. 6A and 6B), so that no fluctuation occurs in the light output 11 (see FIG. 6C). Thus, only the oscillation polarization mode changes as illustrated in FIG. 6D, without any fluctuation in the light output 11.

Further, the current injection can be performed opposite to the manner illustrated in FIGS. 5A and 5B. That is, the current $I_1$ injected into the first active layer 31 is modulated and the current $I_2$ injected into the second active layer 32 remains unchanged.

Second Embodiment

A second embodiment of the present invention will be described with reference to FIG. 7 which illustrates a distributed Bragg reflector semiconductor laser (DBR-LD) constructed in accordance with the present invention. In FIG. 7, reference numeral 41 is a n-type GaAs substrate. Reference numeral 42 is an n-type $Al_{0.5}Ga_{0.5}As$ first clad layer. Reference numeral 61 is a first active layer which has a larger gain for TE mode light. Reference numeral 62 is a second active layer which has a larger gain for TM mode light. Reference numeral 44 is a p-type $Al_{0.5}Ga_{0.5}As$ second clad layer. Reference numeral 45 is a p-type GaAs cap layer. Reference numeral 47 is a first electrode of an alloy of Au and Ge formed on the bottom surface of the substrate 41, reference numeral 48 is a second electrode of an alloy of Au and Cr formed for injecting a current into the first active layer 61, and reference numeral 49 is a third electrode of an alloy of Au and Cr formed for injecting a current into the second active layer 62. Reference numeral 56 is a separation groove for electrically separating the second electrode 48 from the third electrode 49.

The second embodiment has a stucture in which a distributed reflector is connected to one side of the structure of the first embodiment of FIG. 1. The distributed reflector may be connected to each side of the structure of the first embodiment. In the distributed reflector of the second embodiment, its Bragg wavelength can be varied by a current injected into the distributed reflector.

Further, in FIG. 7, reference numeral 50 is a lower grating region of $Al_{0.3}Ga_{0.7}As$. Reference numeral 51 is an upper grating region of $Al_{0.4}Ga_{0.6}As$. Reference numeral 52 is a grating formed at a boundary between the lower and upper grating regions 50 and 51 in the distributed reflector. Reference numeral 55 is a phase adjusting region of $Al_{0.4}Ga_{0.6}As$. Reference numeral 53 is a fourth electrode in the grating region 50, 51 and 52, and reference numeral 54 is a fifth electrode in the phase adjusting region 55.

In the second embodiment, the oscillation polarization mode is changed by substantially the same manner as the first embodiment. In a first control state, currents respectively injected into the first active layer 61, the second active layer 62, the grating region 50, 51 and 52 and the phase adjusting region 55 are appropriately determined such that a gain spectrum of TE mode is dominant and the oscillation in TE mode takes place at the Bragg wavelength of TE mode at which the gain spectrum of TE mode peaks. On the other hand, in a second control state, currents respectively injected into the first active layer 61, the second active layer 62, the grating region 50, 51 and 52 and the phase adjusting region 55 are also appropriately determined such that a gain spectrum of TM mode is dominant and the oscillation in TM mode is caused at the Bragg wavelength of TM mode at which the gain spectrum of TM mode peaks. In the second embodiment, the distributed reflector or grating 52 is formed to narrow the line width of the oscillation light output and to change the oscillation wavelength.

Third Embodiment

Figure 8:
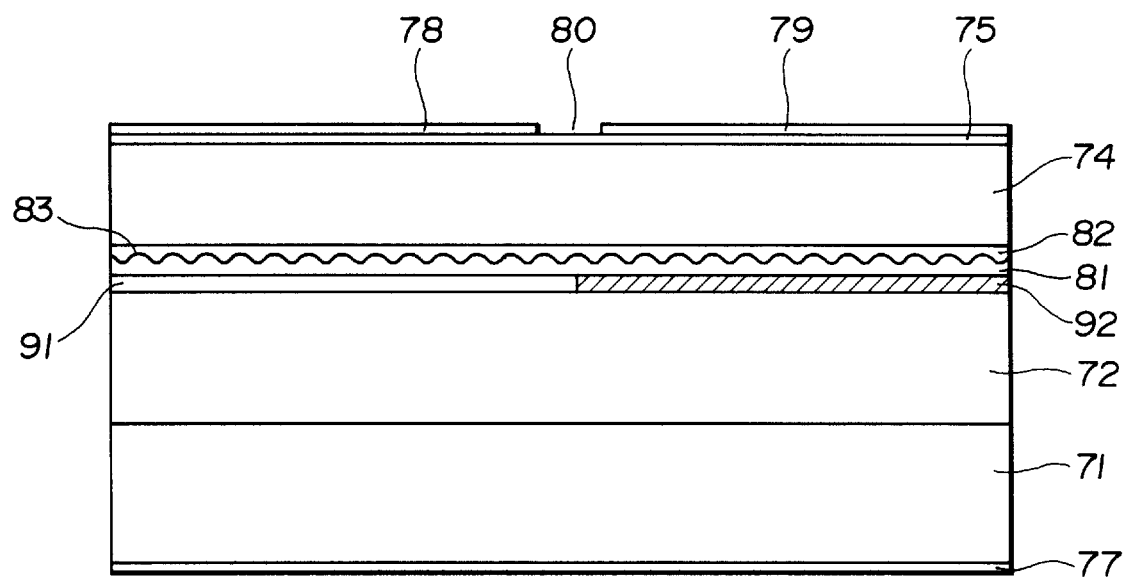
FIG. 8 is a cross sectional view illustrating a third embodiment of a semiconductor laser constructed in accordance with this invention.

A third embodiment of the present invention will be described with reference to FIG. 8 which illustrates a distributed feedback semiconductor laser (DFB-LD) constructed in accordance with the present invention. In FIG. 8, reference numeral 71 is an n-type GaAs substrate. Reference numeral 72 is an n-type $Al_{0.5}Ga_{0.5}As$ first clad layer. Reference numeral 91 is a first active layer which has a larger gain for TE mode light. Reference numeral 92 is a second active layer which has a larger gain for TM mode light. Reference numeral 74 is a p-type $Al_{0.5}Ga_{0.5}As$ second clad layer. Reference numeral 75 is a p-type GaAs cap layer.

Reference numeral 77 is a first electrode of an alloy of Au and Ge formed on the bottom surface of the substrate 71, reference numeral 78 is a second electrode of an alloy of Au and Cr formed for injecting a current into the first active layer 91, and reference numeral 79 is a third electrode of an alloy of Au and Cr formed for injecting a current into the second active layer 92. Reference numeral 80 is a separation groove for electrically separating the second electrode 78 from the third electrode 79.

The third embodiment has a stucture in which a DFB structure is provided in parallel with the first and second active layers 91 and 92 or the structure of the first embodiment shown in FIG. 1.

Furthermore, in FIG. 8, reference numeral 81 is a lower grating region of $Al_{0.3}Ga_{0.7}As$. Reference numeral 82 is an upper grating region of $Al_{0.4}Ga_{0.6}As$. Reference numeral 83 is a grating formed at a boundary between the lower and upper grating regions 81 and 82 in the DFB structure.

In the third embodiment, the oscillation polarization mode is changed in substantially the same manner as the first or second embodiment. In a first control state, currents respectively injected into the first active layer 91 and the second active layer 92 are appropriately determined such that a gain spectrum of TE mode is dominant or prevailing and the oscillation in TE mode is caused at the Bragg wavelength of TE mode at which the gain spectrum of TE mode peaks. On the other hand, in a second control state, currents respectively injected into the first active layer 91 and the second active layer 92 are also appropriately determined such that a gain spectrum of TM mode is dominant and the oscillation in TM mode is caused at the Bragg wavelength of TM mode at which the gain spectrum of TM mode peaks. Also in the third embodiment, the DFB structure or the grating 83 is formed to narrow the line width of the oscillation light output and to change the oscillation wavelength. The third embodiment is similar to fifth and seventh embodiments described below.

In the above-discussed embodiments, a plurality of active regions are serially arranged along an axial direction of a cavity or a resonator, but the active regions may be arranged in a direction perpendicular to the axial direction. Specifically, two active regions may be arranged in a common horizontal plane symmetrically with respect to a central longitudinal axis of the waveguide, extending right and left in parallel along this longitudinal axis, and two electrodes are formed corresponding to the thus-formed active regions. Additionally, two lower and upper active regions may be arranged in a two-layer form, extending in parallel up and down, with a grounded layer inbetween, and two upper and lower electrodes are formed, corresponding to the thus-formed active regions, to independently inject currents into the two active regions.

Fourth Embodiment

A fourth embodiment of the present invention will be described with reference to FIGS. 9 and 10. In this embodiment, two distributed feedback (DFB) regions 111a and 111b are formed on an n-type InP substrate 101, and those DFB regions 111a and 111b are serially arranged to construct a compound resonator as a whole. In diffraction gratings 102a and 102b in the first and second DFB regions 111a and 111b, λ/4 shift sections 110a and 110b (a λ/4 shift section is a phase shift portion which is connected with a phase shift corresponding to (n±¼) times of wavelength λ: n is any integer) are respectively formed to cause a stable single mode oscillation.

Figure 9:
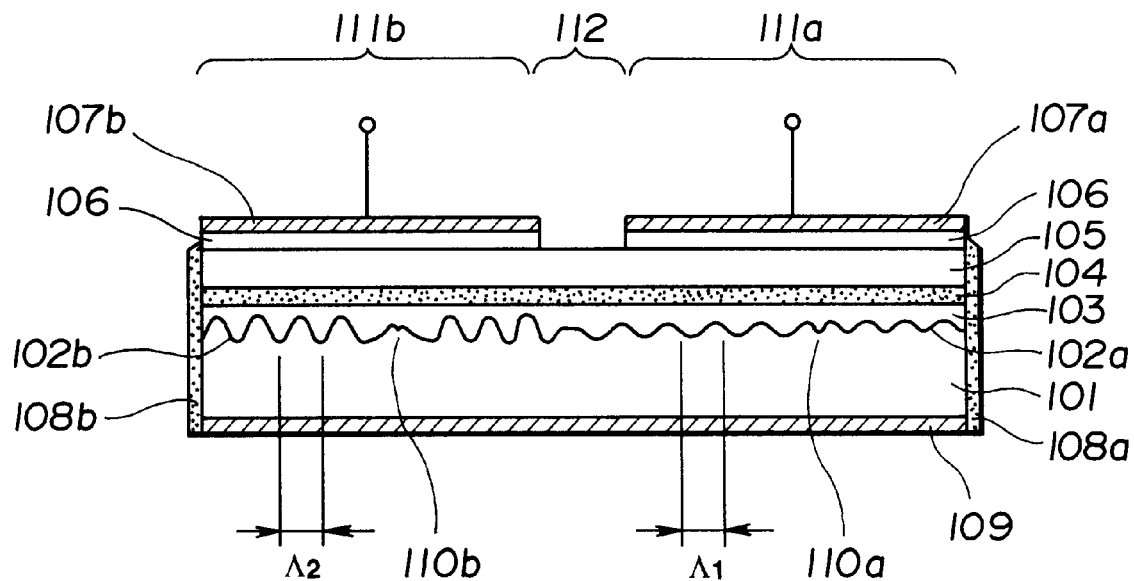
FIG. 9 is a cross sectional view illustrating a fourth embodiment of a semiconductor laser constructed in accordance with this invention.

In FIG. 9, reference numeral 103 is an n-type InP clad layer. Reference numeral 104 is an undoped InGaAsP active layer formed common to both first and second DFB regions 111a and 111b. Reference numeral 105 is a p-type InP clad layer. Reference numeral 106 is a p-type InGaAsP cap layer. Reference numerals 107a, 107b and 109 are metal electrodes. Reference numerals 108a and 108b are antireflection (AR) coatings provided on cleaved end facets. Reference numeral 112 is a transition region for connecting two DFB regions 111a and 111b. The transition region 112 is formed only as a result of the device fabrication, and is not necessarily needed in function. Alternatively, another electrode may be provided on the transition region 112, and the transition region 112 may be changed to a phase adjusting region.

FIG. 9 illustrates a longitudinal cross section of the laser, and the laser naturally has a lateral or transverse light confinement structure. The lateral light confinement structure can be attained by a ridge structure, a burying structure or the like. FIG. 10 illustrates a lateral cross section of the laser, and in this case a burying heterostructure (BH) is adopted. In FIG. 10, InP layers 121, 122 and 123 are layered to form a pnp structure in which the central n-type InP layer 122 is in contact with the active layer 104 so that an ineffective current leaking to side portions can be eliminated.

The fabrication process of this embodiment will be described. On the n-type InP substrate 101, photoresist is initially layered and a diffraction grating pattern is formed by a two-beam exposure method using a He-Cd laser. Then, uneven gratings 102a and 102b are formed on the substrate 101 using a reactive ion beam etching (RIBE) process. In the fourth embodiment, the gratings 102a and 102b in the first and second DFB regions 111a and 111b respectively have different pitches $\Lambda_1$ and $\Lambda_2$ and different grating depths or locations. Therefore, those gratings 102a and 102b need to be consecutively formed by separate independent processes. When one of the gratings 102a and 102b is formed, the region of the other grating needs to be covered with a mask. Further, when the gratings 102a and 102b are formed, the regions 111a and 111b are respectively divided into two areas at a boundary where each of the λ/4 shift sections 110a and 110b is to be formed and a mask pattern for the etching process is inverted between those two areas. Thus, the λ/4 shift sections 110a and 10b are formed in the regions 111a and 111b.

Then, a regrowth process is performed on the substrate 101 on which the gratings 102a and 102b are formed. A metal organic chemical vapor deposition (MOCVD) method is used for the regrowth. Other methods, such as a liquid phase epitaxy (LPE) method or a molecular beam exitaxy (MBE) method, can be used for the regrowth. The n-type InP layer 103 is initially formed by the MOCVD. Before the start of the regrowth, a thermal cleaning or formation of a super-lattice buffer layer may be performed, when necessary. Then, the undoped InGaAsP active layer 104 whose bandgap wavelength $\lambda_g$ is 1.5 μm, the p-type InP layer 105 and the p-type InGaAsP cap layer 106 are grown, and thus the consecutive regrowth epitaxial process has been completed. After that, a striped mask is formed by photolithography to fabricate a channel waveguide, and a mesa-shaped channel stripe is formed by RIBE.

Figure 10:
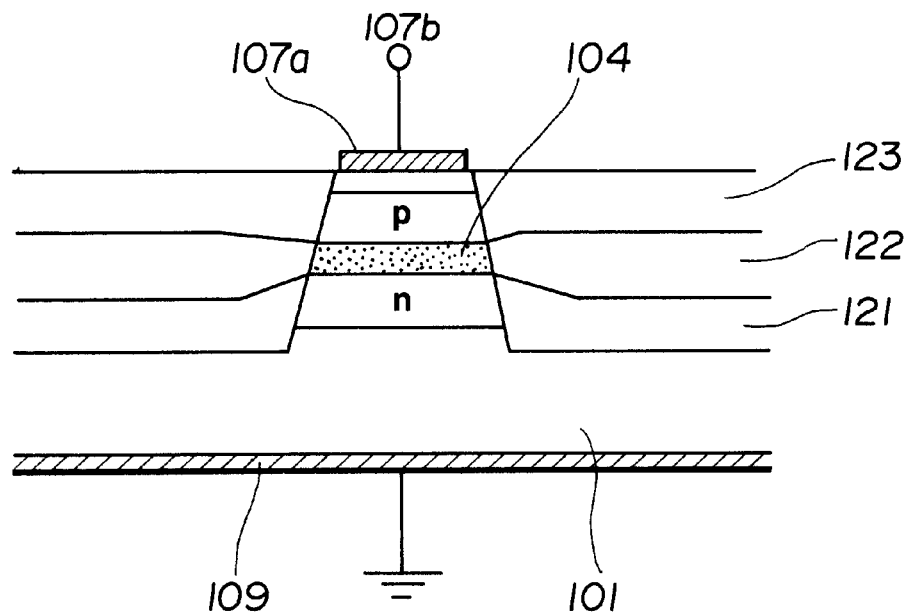
FIG. 10 is a transverse cross sectional view of the fourth embodiment.

A selective growth is performed on the surroundings of the stripe by MOCVD, and the p-type InP layer 121, the n-type InP layer 122 and the p-type InP layer 123 are layered as shown in FIG. 10. The n-type InP layer 122 is brought into contact with the side of the active layer 104 to reduce the ineffective current leaking, as described above. After the substrate 101 is lapped to a desired thickness, Au/Au-Zn metal films for the upper electrodes 107a and 107b and the lower electrode 109 are deposited. Those films are alloy-processed and an ohmic process is performed. Finally, the wafer is cleaved into a bar-shaped wafer, and the SiO$_x$ AR coatings 108a and 108b are formed on the end facets by an electron beam (EB) deposition. The thus-fabricated wafer is constructed into a chip, and die bonding and wire bonding are performed on a stem. Thus, the fabrication of a semiconductor laser device is completed.

The operation of the fourth embodiment will be described. In the DFB regions 111a and 111b, the grating pitches $\Lambda_1$ and $\Lambda_2$ are set such that oscillations in TE and TM modes are respectively dominant at peak wavelengths in gain spectra of TE and TM modes when appropriate currents are respectively injected into the DFB regions 111a and 111b.

Figure 11:
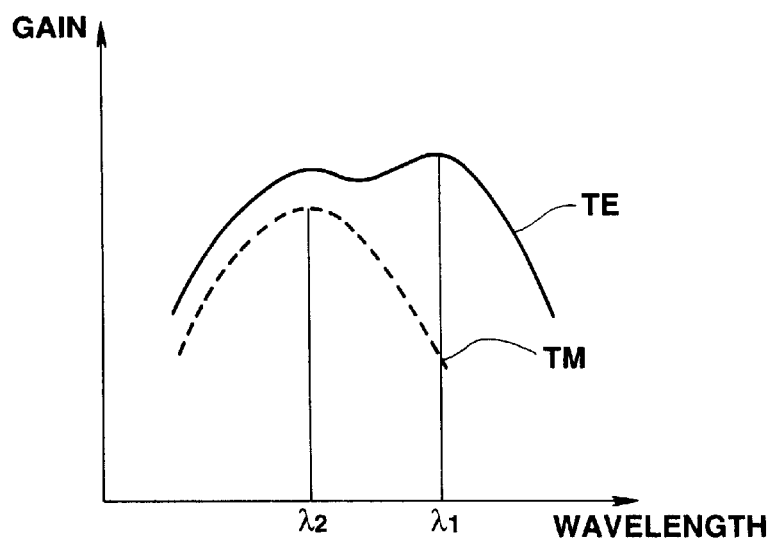
FIG. 11 is a graph of gain spectra of TE and TM modes of the fourth embodiment.

FIG. 11 schematically illustrates modal gains of TE and TM modes of the InGaAsP active layer 104. The TE mode gain has a peak at a wavelength $\lambda_1$, and the TM mode gain has a peak at a wavelength $\lambda_2$. The peak wavelengths vary depending on the amounts of injected currents, and those amounts are set to about such levels that the oscillation thresholds in the DFB regions 111a and 111b are close to each other and the competition between oscillations in TE and TM modes is positively established. The grating pitches $\Lambda_1$ and $\Lambda_2$ in the DFB regions 111a and 111b are respectively determined by the following Bragg conditions:

$$\Lambda_1 = \lambda_1/2N_1 \qquad (1)$$

$$\Lambda_2 = \lambda_2/2N_2 \qquad (2)$$

where $N_1$ and $N_2$ are respectively the nomalized propagation constants (or effective or equivalent refractive indices) for TE and TM modes in the DFB regions 111a and 111b. In other words, the Bragg wavelengths for TE and TM modes are respectively equated with the peak gain wavelengths $\lambda_1$ and $\lambda_2$ of TE and TM modes. Furthermore, the threshold gains in the DFB regions 111a and 111b need to be close to each other to bring forth the competition between oscillations in TE and TM modes. There are several methods for achieving that purpose. Basically, coupling coefficients between the gratings 102a and 102b and the waveguides for TE and TM modes only need to be adjusted. Various methods exist to adjust the coupling coefficient. For example, to adjust the depth of grating, to adjust the positional relationship between grating and waveguide, to adjust the relationship between indices of grating and waveguide, to adjust the confinement coefficient, and so forth. Those methods are related to each other. For example, the coupling coefficients for the respective polarization modes can be made close to each other by decreasing the depth of the grating for the mode whose gain is high (i.e., TE mode in the example of FIG. 11) and increasing the depth of the grating for the mode whose gain is low (i.e., TM mode in the example of FIG. 11). In the fourth embodiment, the depth of the grating 110a in the DFB region 111a for TE mode, whose gain is large, is made smaller than the depth of the grating 102b in the DFB region 111b for TM mode, whose gain is low, so that the threshold gains for TE and TM modes approach to each other. Thus, the threshold gains for TE and TM modes balance. In FIG. 9, the difference in the grating depth is exaggerated.

Figure 12:
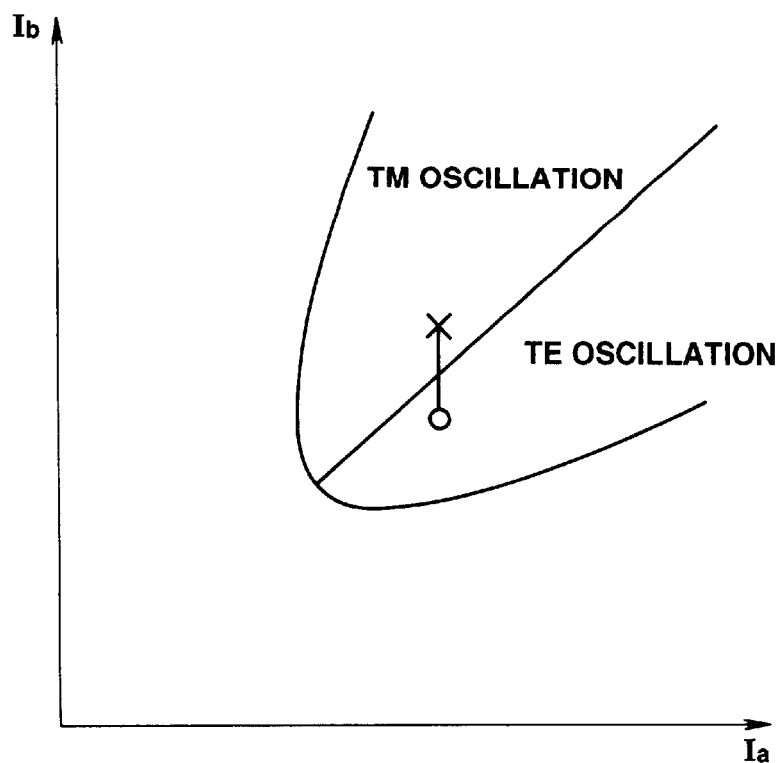
FIG. 12 is a graph of the relationship between injected currents and oscillation modes.

A method for modulating the device will be described. The relationship between currents $I_a$ and $I_b$ injected into the two DFB regions 111a and 111b and the oscillation mode is illustrated in FIG. 12. Areas of TE and TM oscillations are defined as shown in FIG. 12. When an appropriate combination of two currents ($I_a$, $1b$) above their oscillation thresholds is selected, an oscillation output can be obtained in a desired oscillation mode (TE or TM mode). For example, if the bias currents $I_a$ and $I_b$ are set at a point indicated by a circle (○) in FIG. 12, TE mode oscillation occurs. In this state, when a minute current is added to the bias current $I_b$ injected into the second DFB region 111b to modulate the bias current $I_b$, the currents $I_a$ and $I_b$ are shifted to a point indicated by a cross (X) and TM mode oscillation takes place in a moment. In other words, an output signal of the device is polarization-modulated by superposing a modulation current $\Delta I_b$ on a bias current $I_b$. The amount of the modulation current $\Delta I_b$ is about several mA that is substantially equal to that of the case of FSK modulation. As a result, a large extinction ratio can be obtained and the device can be operated with little chirping.

A polarization-modulated light signal output from the laser can be converted to an amplitude-modulated or amplitude shift keying (ASK) signal by a polarization selecting element, such as a polarizer and a polarization prism. The polarization selecting element is positioned in front of an output end of the laser to select only a desired polarization component.

The above-discussed fabrication method, setting method and modulating methods can be applied to other embodiments described above and below, within a scope of nature thereof.

Fifth Embodiment

A fifth embodiment of the present invention will be described with reference to FIGS. 13 and 14. In this embodiment, gratings are formed above a waveguide, while the gratings are formed under the waveguide in the fourth embodiment. Furthermore, different active layers 143a and 143b are respectively formed in two DFB regions 149a and 149b in this embodiment so that respective polarization modes (TE and TM modes) can have effective gains, while a common active layer is used in both the two DFB regions in the fourth embodiment. As a result, threshold gains for TE and TM modes of the two regions 149a and 149b can be made close to each other without causing the depths of the gratings 144a and 144b to largely differ from each other.

Figure 13:
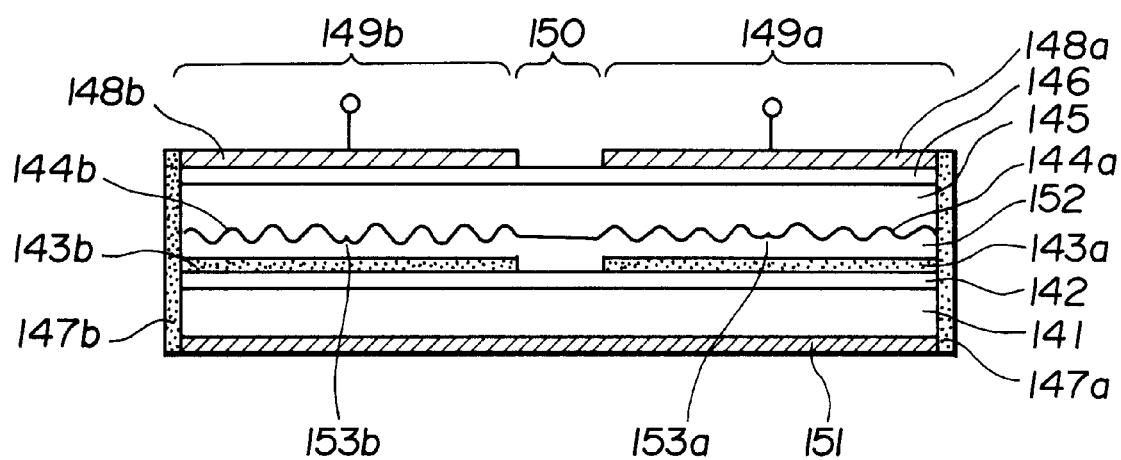
FIG. 13 is a cross sectional view illustrating a fifth embodiment of a semiconductor laser constructed in accordance with this invention.

In FIG. 13, reference numeral 141 is an n-type InP substrate. Reference numeral 142 is an n-type InP clad layer. Reference numeral 145 is a p-type InP clad layer. Reference numeral 146 is a p-type InGaAsP cap layer. Reference numerals 148a, 148b and 151 are metal electrodes. Reference numerals 147a and 147b are AR coatings provided on cleaved end facets. Reference numeral 150 is a transition region for connecting the first and second DFB regions 149a and 149b. Reference numeral 152 is a guide layer. Reference numerals 153a and 153b are $\lambda/4$ shift sections.

Figure 14:
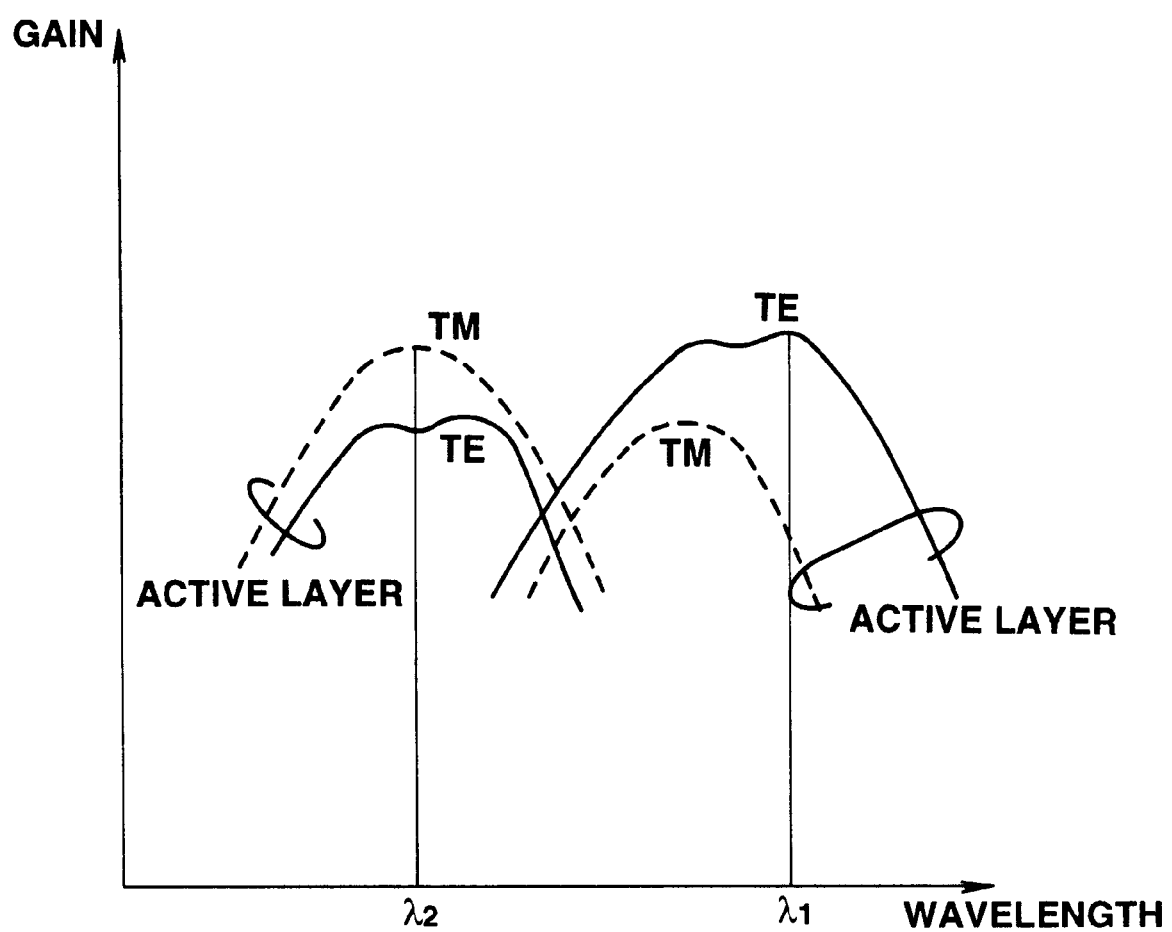
FIG. 14 is a graph of gain spectra of TE and TM modes of the fifth embodiment.

FIG. 14 illustrates gain spectra of the two active layers 143a and 143b in the two regions 149a and 149b of the fifth embodiment. Solid lines indicate the gain spectrum of TE mode and dotted lines indicate the gain spectrum of TM mode. Similar to the fourth embodiment, the Bragg wavelengths $\lambda_1$ and $\lambda_2$ for TE and TM modes are set at gain peaks for TE and TM modes such that TE mode is dominant in the first DFB region 149a and TM mode is dominant in the second DFB region 149b. Pitches $\Lambda_1$ and $\Lambda_2$ of the gratings 144a and 144b are set corresponding to the thus-determined Bragg wavelengths $\lambda_1$ and $\lambda_2$.

In the fifth embodiment, the active layer 143a has an ordinary active structure of InGaAsP series, and the active layer 143b has a strained super-lattice active structure of InGaAsP series to increase the gain for TM mode. The strained super-lattice is used in a well layer or a barrier layer. A selective growth by CBE method is performed to form those layers. In FIG. 14, the gain spectra of the two active layers 143a and 143b are depicted with being intentionally moved away from each other for easy understanding. But in truth it is desirable to make those gain spectra sufficiently close to each other. When the Bragg wavelengths $\lambda_1$ and $\lambda_2$ are properly set considering the difference between effective refractive indices $N_1$ and $N_2$ for TE and TM modes, it is possible to make the grating pitches $\Lambda_1$ and $\Lambda_2$ equal to each other according to the relations (1) and (2). Under such conditions, a single process for forming the gratings 144a and 144b is only needed, so a method for fabricating the gratings 144a and 144b becomes quite easy to perform. Thus, reproducibility of the device is improved. The operation and driving method of the fifth embodiment are the same as those of the third and fifth embodiments.

Sixth Embodiment

A sixth embodiment of the present invention will be described with reference to FIGS. 15 through 20.

Figure 15:
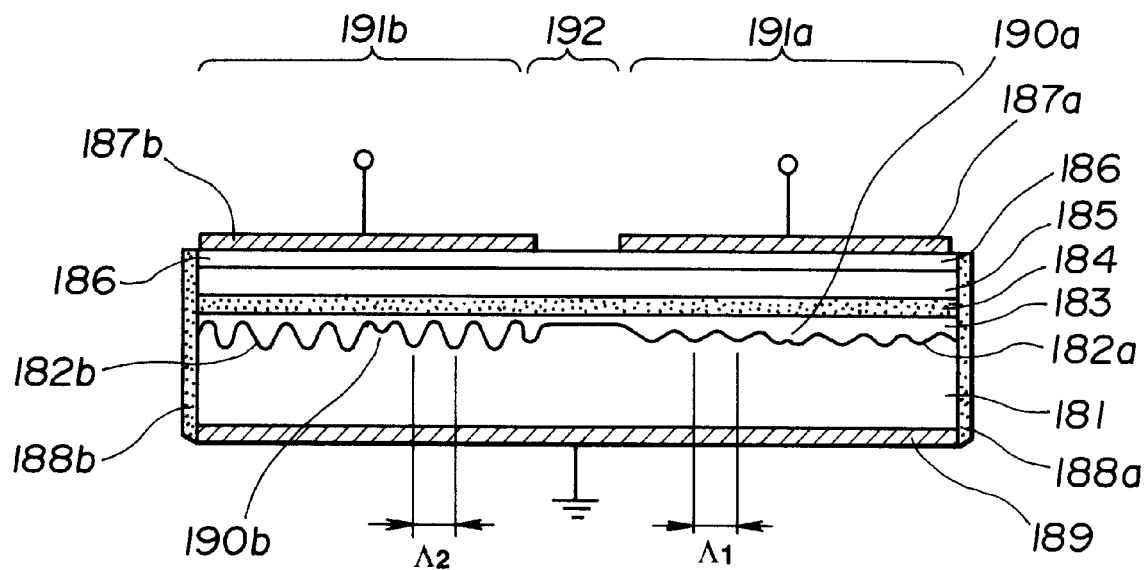
FIG. 15 is a cross sectional view illustrating a sixth embodiment of a semiconductor laser constructed in accordance with this invention.

In FIG. 15, reference numeral 181 is an n-type InP substrate. Reference numerals 182a and 182b are gratings. Reference numeral 183 is an n-type InGaAsP guide layer whose thickness is 0.2 μm and whose bandgap wavelength $\lambda_g$ is 1.3 μm. Reference numeral 184 is a multi-quantum well (MQW) active layer. Reference numeral 185 is a p-type InP clad layer whose thickness is 0.5 μm. Reference numeral 186 is a p-type InGaAsP cap layer. Reference numerals 187a, 187b and 189 are metal electrodes. Reference numerals 188a and 188b are AR coating as provided on cleaved end facets. Reference numerals 190a and 190b are λ/4 shift sections. Reference numerals 191a and 191b are first and second DFB regions. Reference numeral 192 is a transition region for connecting the two DFB regions 191a and 191b and separating current injections into the DFB regions 191a and 191b from each other. The active layer 184 includes eight pairs of InGaAs well layers (thickness: 6 nm) and InGaAs barrier layers whose bandgap wavelength $\lambda_g$ is 1.3 μm (thickness: 10 nm), and those well and barrier layers are all undoped.

FIG. 15 illustrates a longitudinal cross section of the laser, and the lateral light confinement structure of the sixth embodiment is the same as that of the fourth embodiment. Further, the fabrication process of the device of the sixth embodiment is also substantially the same as that of the fourth embodiment.

Figure 16:
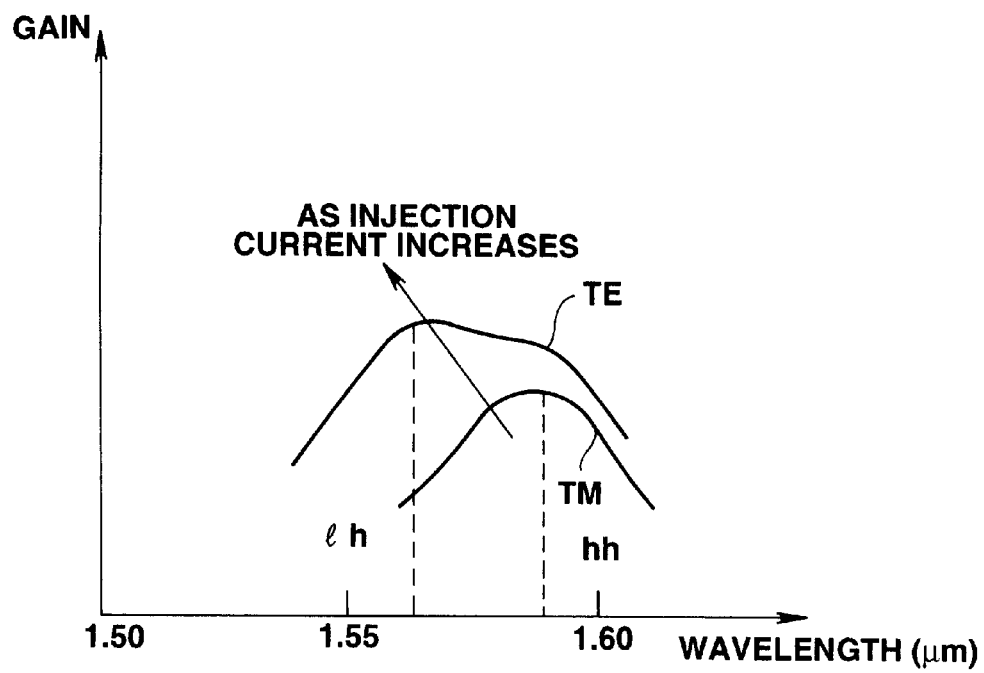
FIG. 16 is a graph of gain spectra of a quantum well active layer of the sixth embodiment.

The operation of this embodiment will be described. When the gain spectrum of the quantum well active layer 184 is considered, the gain peak due to the transition between heavy holes (hh) in the valence band and electrons in the conduction band exists near 1.58 μm under a low current injection condition, as shown in FIG. 16. Therefore, TE mode is prevailing in that wavelength range. As the injected current is increased, the gain peak due to the transition between light holes (lh) in the valence band and electrons in the conduction band appears near 1.56 μm, and at the same time the gain of TM mode near the wavelength of 1.56 μm increases.

Figure 17:
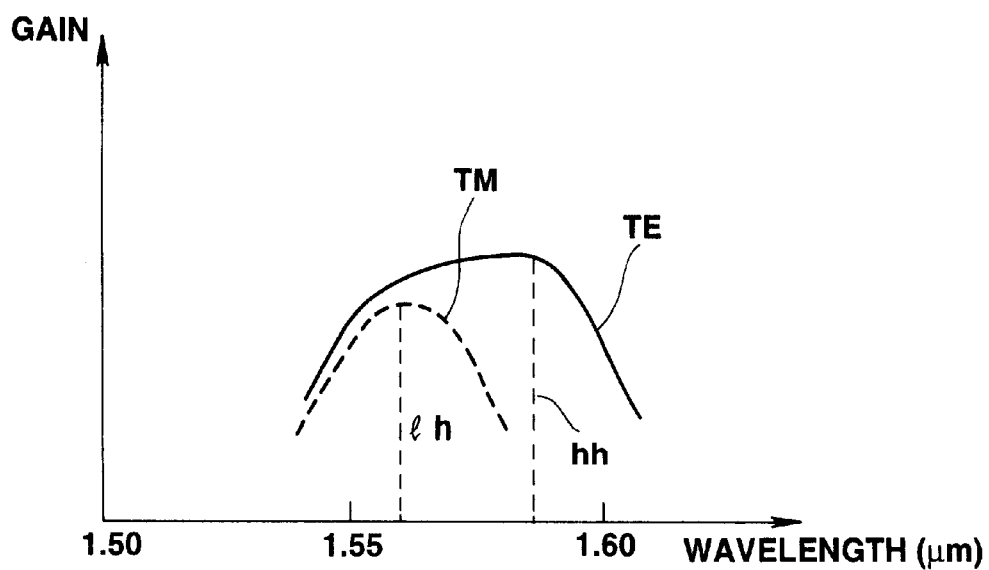
FIG. 17 is a graph of gain spectra of TE and TM modes of a quantum well active layer of the sixth embodiment.

FIG. 17 schematically illustrate modal gains of TE and TM modes. The TE mode gain has a peak gain at the transition wavelength of hh, and the TM mode gain has a peak gain at the transition wavelength of lh. The peak wavelengths vary depending on device temperature and amounts of injected currents, In this embodiment, the Bragg wavelengths of the first and second DFB regions 191a and 191b are set near those peak wavelengths so that polarization modes dominant in the respective regions 191a and 191b are determined.

In the first DFB region 191a, the Bragg wavelength for TE mode is set at a wavelength $\lambda_1$, which corresponds to the hh transition, such that the TE mode is dominant therein. In the second DFB region 191b, the Bragg wavelength for TM mode is set at a wavelength $\lambda_2$, which corresponds to the lh transition, such that the TM mode is prevailing therein. The grating pitches $\Lambda_1$ and $\Lambda_2$ of the gratings 182a and 182b are respectively determined by the following Bragg conditions:

$$\Lambda_1 = \lambda_1/2n_{TE}$$

$$\Lambda_2 = \lambda_2/2n_{TM}$$

where $n_{TE}$ and $n_{TM}$ are respectively the equivalent refractive indices for TE and TM modes in the two regions 191a and 191b. This is substantially the same as the fourth embodiment.

Figure 18:
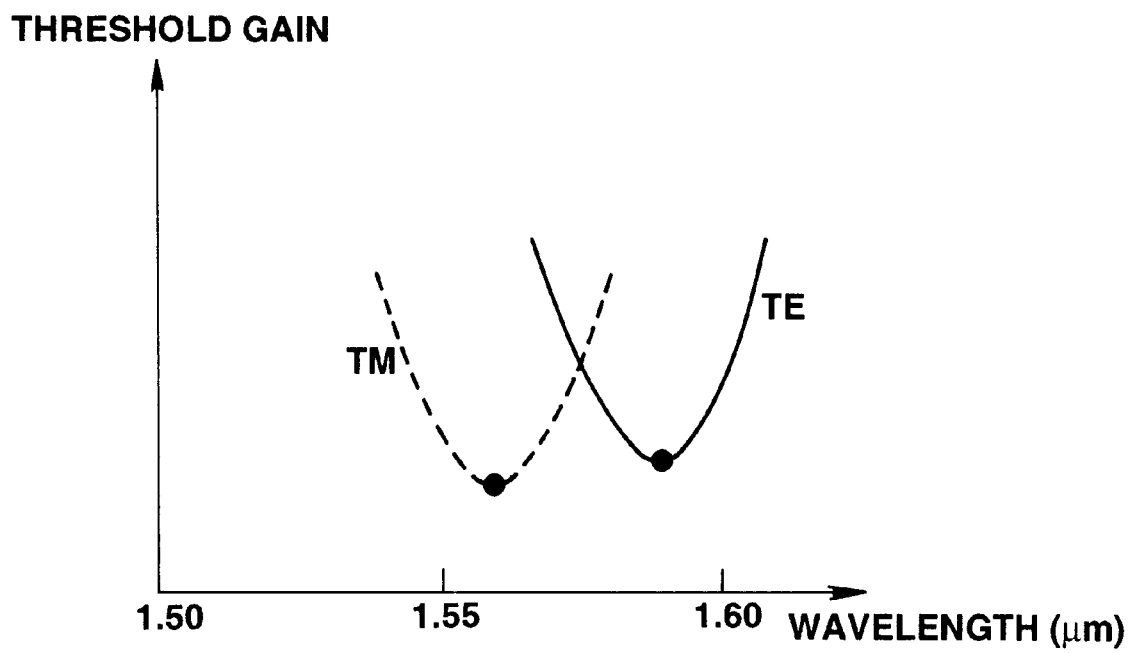
FIG. 18 is a graph of threshold gains of TE and TM modes of the sixth embodiment.

FIG. 18 schematically illustrates threshold gains of TE and TM modes. In the case of a compound resonator, those functions must be multiplied by each other. Those threshold gains need to be balanced with each other to effectively create the competition between TE and TM modes. In the sixth embodiment, the grating coupling coefficient in the first DFB region 191a for TE mode is reduced, so that the effective threshold gain of TE mode is raised relative to that of TM mode in the second DFB region 191b. For this purpose, the depth of the grating 182a is made shallow as shown in FIG. 15. Methods for adjusting the coupling coefficient have already been described in the fourth embodiment.

Figure 19:
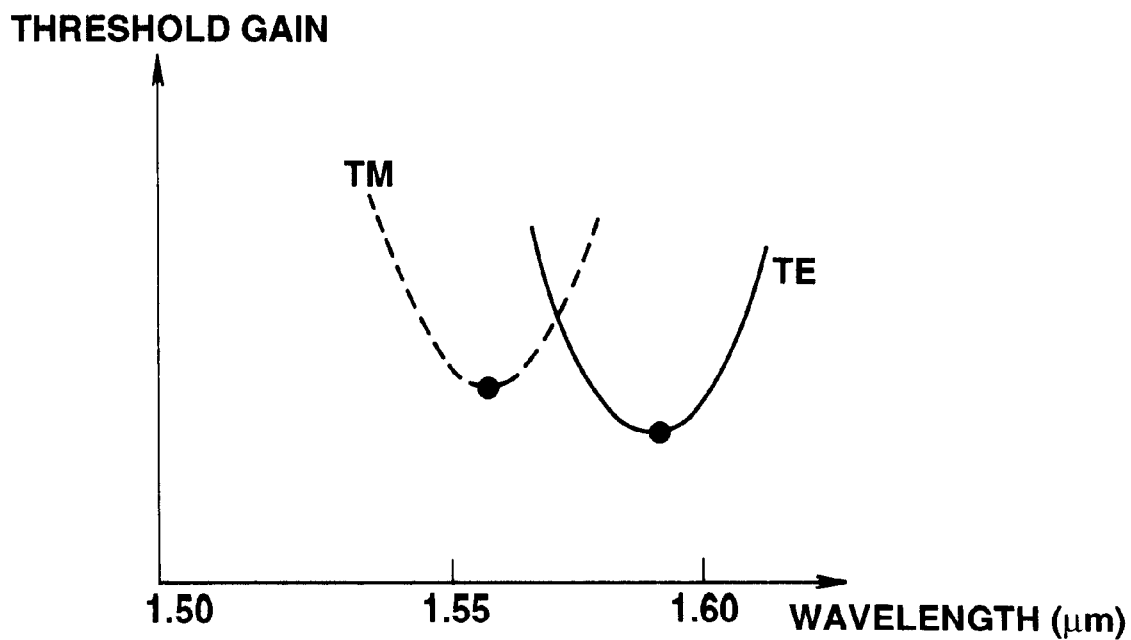
FIG. 19 is a graph of threshold gains of TE and TM modes of the sixth embodiment.

In FIG. 18, the threshold gain of TM mode is smaller, and as a whole the oscillation in TM mode prevails. FIG. 19 illustrates the condition under which the threshold gain of TE mode is lowered by changing the ratio between currents injected into the first and second DFB regions 191a and 191b and the oscillation in TE mode is made dominant as a whole. In a high injection state, the gain due to the hh transition (connected with TE mode) is saturated, and the gain due to the lh transition (connected with TM mode) tends to increase. Therefore, the oscillation in TM mode can be controlled by changing the current injection condition in the high current injection state. Thus, it is possible to switch the oscillation mode between TE and TM modes as illustrated in FIGS. 18 and 19.

Figure 20:
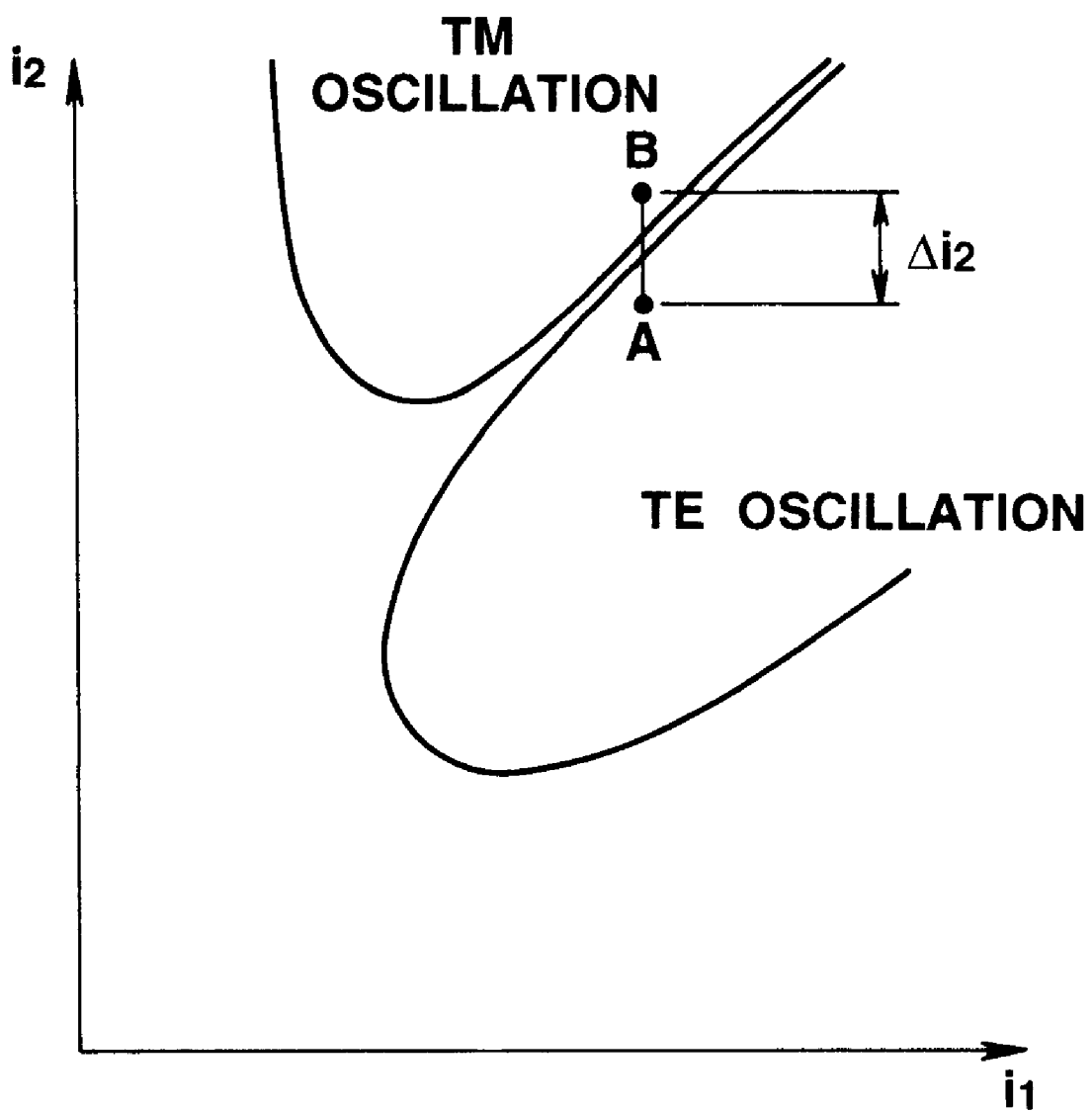
FIG. 20 is a graph of the relationship between injected currents and oscillation modes.

FIG. 20 shows the relationship between currents $i_1$ and $i_2$ injected into the two DFB regions 191a and 191b and oscillation modes. A modulation component $\Delta i_2$ is superposed on a current $i_2$ with a bias point being set at a point A or B in FIG. 20 to cause the switching between TE and TM modes. The amplitude of $\Delta i_2$ is about several mA, and the extinction ratio or power ratio between polarization modes of more than 20 dB can effectively be obtained.

The modulated signal itself is only modulated in polarization mode. Therefore, a polarizer is placed in front of the semiconductor laser to convert the output to an intensity-modulated signal, and the axis of the polarizer is adjusted to the axial direction of a desired polarization mode (the electric field direction of TE or TM mode). As a result, a large extinction ratio can be achieved and the device can be operated with little chirping. The chirping is below 1 Å when the TE mode output is measured. Further, the modulation frequency band of the polarization mode modulation can be more than 500 MHz.

Seventh Embodiment

A seventh embodiment of the present invention will be described with reference to FIGS. 21 through 24. In this embodiment, gratings 244a and 244b are formed above a waveguide, while the gratings are formed under the waveguide in the sixth embodiment. Furthermore, different active layers 243a and 243b are respectively formed in two DFB regions 249a and 249b in this embodiment so that respective polarization modes (TE and TM modes) can have effective gains, while a common active layer is used in both the two DFB regions in the sixth embodiment. As a result, similar to the sixth embodiment, threshold gains of TE and TM modes can be made close to each other without causing the depths of the gratings 244a and 244b to largely differ from each other. The relationship between the sixth and seventh embodiments is about the same as that between the fourth and fifth embodiments.

Figure 21:
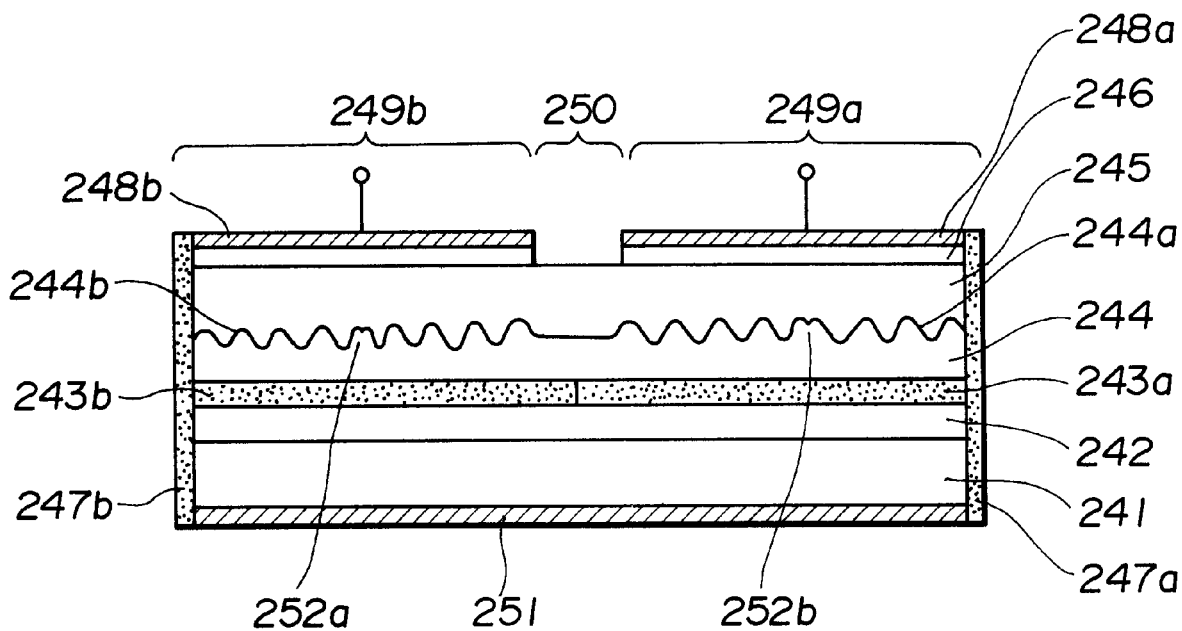
FIG. 21 is a cross sectional view illustrating a seventh embodiment of a semiconductor laser constructed in accordance with this invention.

The basic layer structure of the seventh embodiment is about the same as that of the sixth embodiment. In FIG. 21, reference numeral 241 is an n-type InP substrate. Reference numeral 242 is an n-type InP clad layer. Reference numeral 244 is an InGaAsP guide layer. Reference numeral 245 is a p-type InP clad layer. Reference numeral 246 is a p-type InGaAsP cap layer. Reference numerals 247a and 247b are AR coatings provided on cleaved end facets. Reference numerals 248a, 248b and 251 are metal electrodes. Reference numerals 252a and 252b are $\lambda/4$ shift sections. Reference numeral 250 is a transition region for connecting the two DFB regions 249a and 249b and separating current injections into the two DFB regions 249a and 249b from each other.

Figure 22:
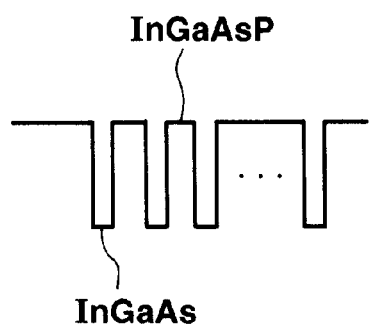
FIG. 22 illustrates the energy band structure of a strained super-lattice active layer of the seventh embodiment.

In this embodiment, to equate gains of different polarization modes with each other, the multi-quantum well active layer 243a consisting of undoped InGaAs well layers/ undoped InGaAsP barrier layers of non-strained lattice matching series similar to that of the sixth embodiment is used in the first DFB region 249a, while the multi-quantum well active layer 243b of an undoped strained super-lattice is used in the second DFB region 249b. In the strained super-lattice layer 243b, InGaAs well layers having a thickness of 6 nm and a tensile strain of 1% and InGaAsP barrier layers having a thickness of 10 nm and a bandgap wavelength $\lambda_g$ of 1.3 $\mu$m are used to construct the multi-quantum well structure by eight pairs of those well and barrier layers. FIG. 22 illustrates the energy structure in the conduction band of the strained super-lattice active layer 243b.

Figure 23:
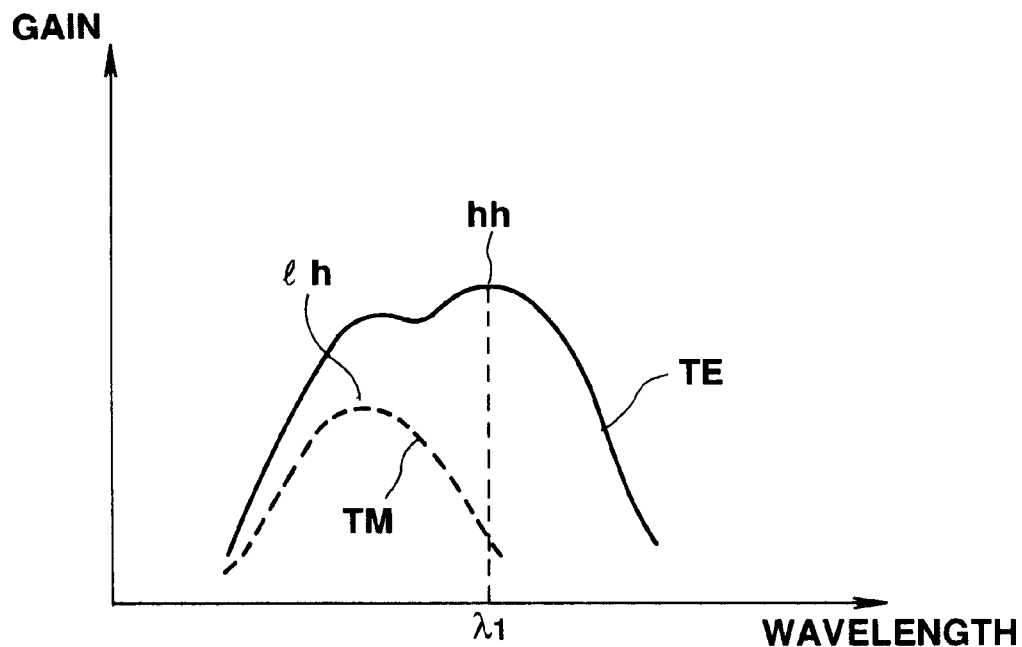
FIG. 23 is a graph of gain spectra of TE and TM modes of an active layer of the seventh embodiment.

FIG. 23 illustrates gain spectra of TE and TM modes of the active layer 243a in the first DFB region 249a by a solid line and a dotted line, respectively. The corresponding Bragg wavelength $\lambda_1$ for TE mode of the first DFB region 249a is set at a gain peak of TE mode. For this purpose, the pitch of the diffraction grating 244a is determined such that the Bragg wavelength $\lambda_1$ comes close to a wavelength due to the hh transition (i.e., the gain peak of TE mode).

Figure 24:
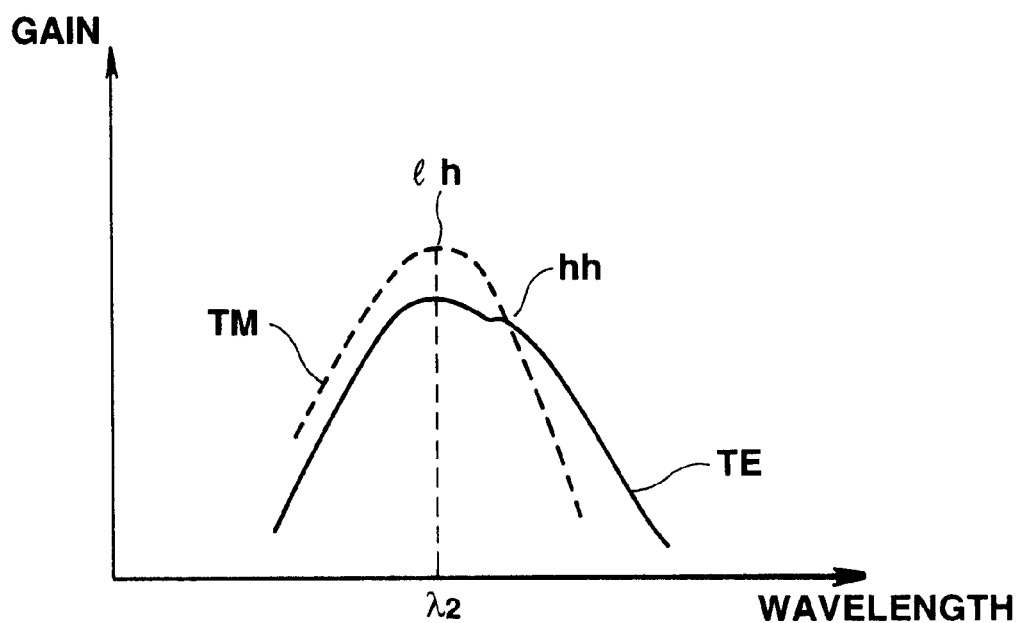
FIG. 24 is a graph of gain spectra of TE and TM modes of the strained super-lattice active layer of the seventh embodiment.

In the strained active layer 243b, a wavelength due to the lh transition is caused to approach a wavelength due to the hh transition as tensile strain is introduced thereinto, and the gain of TM mode tends to increase. FIG. 24 illustrates gain spectra of TE and TM modes of the strained active layers 243b in the second DFB region 249b by a solid line and a dotted line, respectively. The corresponding Bragg wavelength $\lambda_2$ for TM mode of the second DFB region 249b is set at a gain peak of TM mode which corresponds to the lh-transition wavelength. For this purpose, the pitch of the diffraction grating 244b is properly determined.

The relationship between the lh-transition wavelength and the hh-transition wavelength is determined by a manner of strain introduction, so the Bragg wavelengths $\lambda_1$ and $\lambda_2$ for TE and TM modes can be made close to each other. Therefore, the above-discussed device can be achieved by setting the diffraction gratings at an equal value ($\Lambda=\Lambda_1=\Lambda_2$), considering only a difference between propagation constants $n_{TE}$ and $n_{TM}$ for the respective polarization modes. That is, the following relation only need to be established:

$\lambda_1/2n_{TE}=\lambda_2/2n_{TM}$.

Like the fifth embodiment, the device of this embodiment can be fabricated with a common grating pitch, and the fabrication yield can be improved. In this embodiment, similar to the fourth embodiment, the polarization mode modulation operation with a high extinction ratio can be attained when bias currents injected into the two electrodes 248a and 248b are appropriately selected and a modulation signal is added to at least one of the bias currents (see FIG. 12).

Eighth Embodiment

An eighth embodiment of the present invention will be described with reference to FIGS. 25A, 25B, 26 and 27. In this embodiment, a first order or higher order peak due to the hh or lh transition is utilized in addition to the 0-th order or ground transition in an active layer of a multi-quantum well structure. The DFB structures are the same as those of the above embodiments.

Figure 25A:
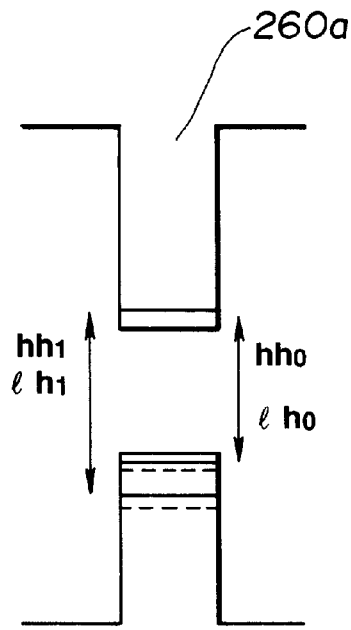
FIGS. 25A and 25B respectively illustrate the energy band structures of two active layers of an eighth embodiment.
Figure 25B:
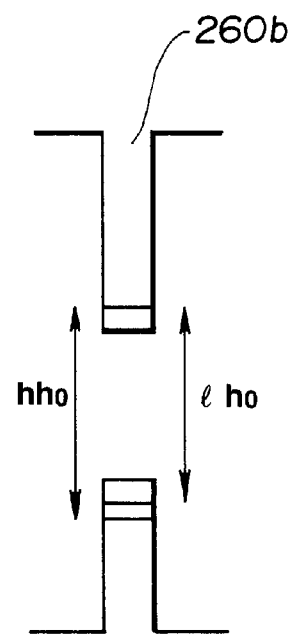
Figure 26:
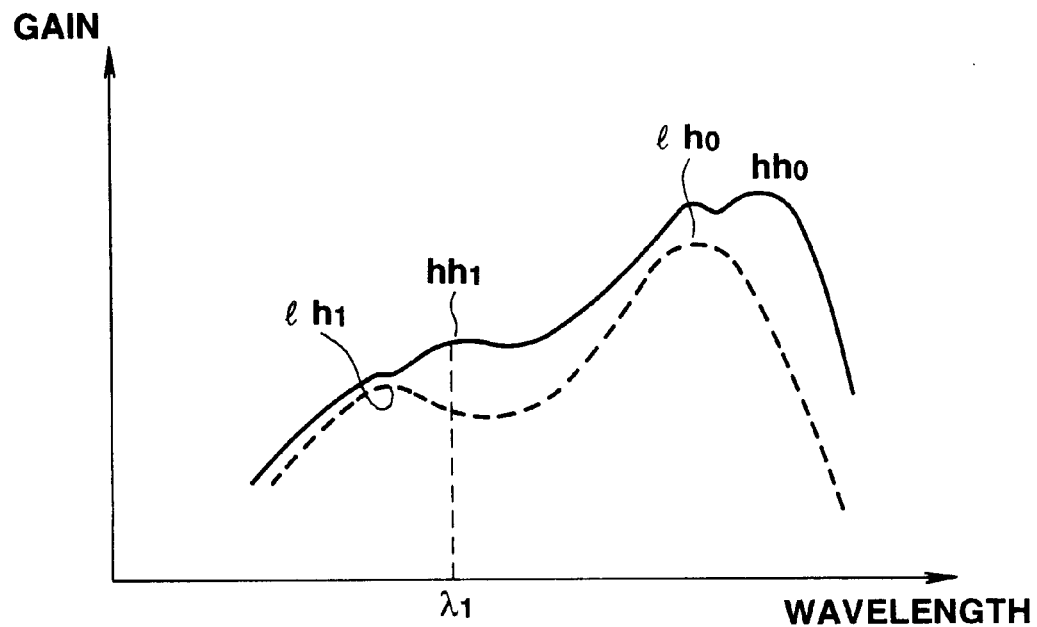
FIG. 26 is a graph of gain spectra of TE and TM modes of a quantum well active layer of the eighth embodiment.
Figure 27:
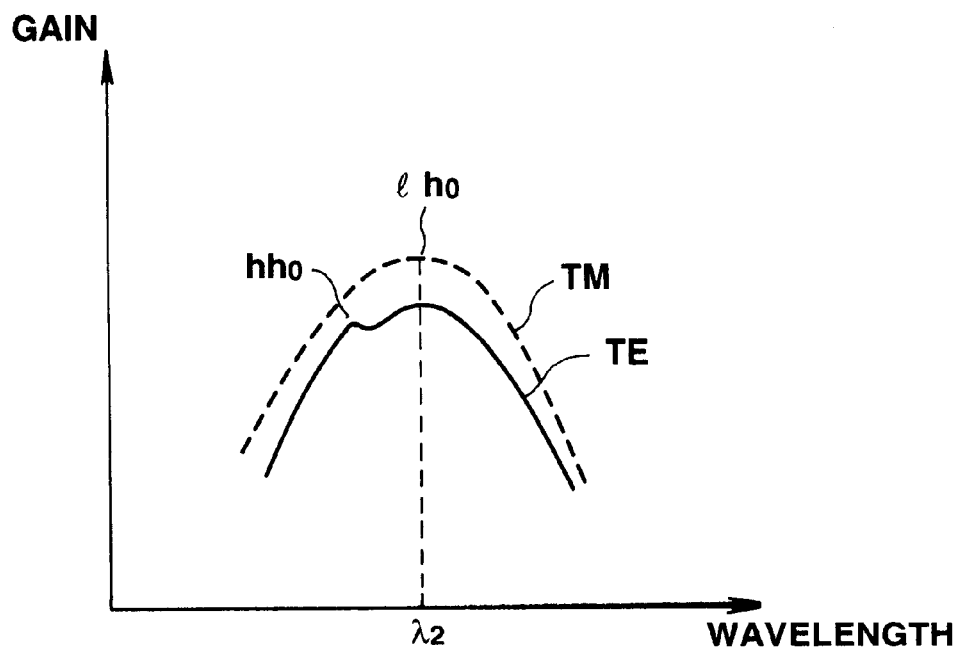
FIG. 27 is a graph of gain spectra of TE and TM modes of a strained super-lattice active layer of the eighth embodiment.
Figure 28:
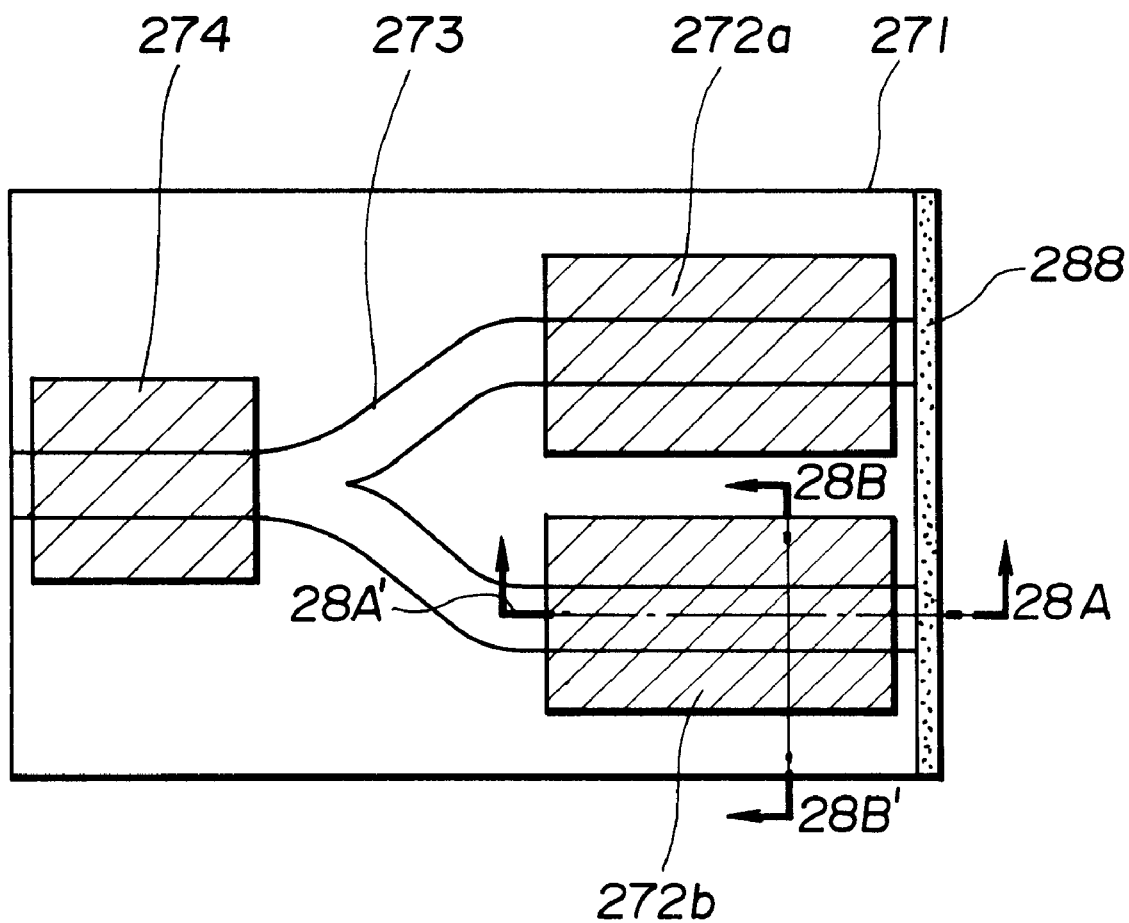
FIG. 28 is a plan view illustrating a ninth embodiment of a semiconductor laser constructed in accordance with this invention.

FIG. 25A illustrates the energy band structure of a quantum well active layer 260a having a relatively wide well layer in which the first order quantum levels $hh_1$ and $lh_1$ are excited by an appropriate injection carrier density and gains appear in corresponding wavelength ranges. FIG. 25B illustrates the energy band structure of a strained quantum well active layer 260b as described in the seventh embodiment, in which a TM mode gain peaks at a wavelength due to the $lh_0$ transition. Those two active layers 260a and 260b are respectively used in the two DFB regions. Although FIGS. 25A and 25B respectively illustrate single wells, a multi-well structure can also be used. In the TE mode region, the diffraction grating pitch is set such that the $hh_1$-transition wavelength, which is the first order quantum level of the active layer 260a, falls at the Bragg wavelength $\lambda_1$ for TE mode (see FIG. 26). In the TM mode region, the grating pitch is also set such that the $lh_0$-transition wavelength, which is the 0-th order quantum level of the active layer 260b, falls at the Bragg wavelength $\lambda_2$ for TM mode (see FIG. 27).

In such a manner, bias currents injected into the two DFB regions are properly selected such that oscillations in TE and TM modes respectively prevails in those regions, and the switching between oscillations in TE and TM modes is performed by slightly modulating the bias current. In the eighth embodiment, spontaneous emission light occurs due to the transition of the 0-th order quantum level in the active layer 260a (see FIG. 27), but this light can be removed by using a filter or the like. Thus, a decline of the extinction ratio can be prevented to a considerable extent.

Ninth Embodiment

A ninth embodiment of the present invention will be described with reference to FIGS. 28 through 31. In this embodiment, two DFB regions 272a and 272b are formed on an n-type InP substrate 271, and a Y-shaped branching and combining portion 273 is formed for combining outputs from the two DFB regions 272a and 272b. Further, an optical amplifier portion 274 is formed at an output section. The laser oscillation is performed by a compound resonator structure including the two DFB regions 272a and 272b. The optical amplifier portion 274, which acts as a common output section, serves to adjust gain and phase of the resonator.

Figure 29:
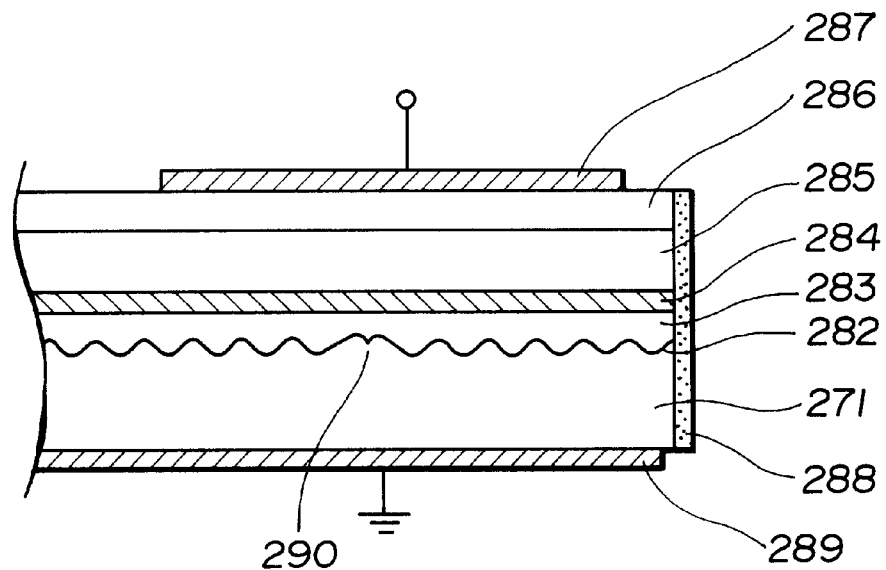
FIG. 29 is a 28A-28A' cross sectional view of FIG. 28.

The layer structure of the ninth embodiment will be described. FIG. 29 is a 28A-28A' cross section of FIG. 28. In FIG. 29, reference numeral 282 is a diffraction grating. Reference numeral 283 is an n-type InP clad layer. Reference numeral 284 is an undoped InGaAsP active layer. Reference numeral 285 is a p-type InP clad layer. Reference numeral 286 is a p-type InGaAsP cap layer. Reference numerals 287 and 289 are metal electrodes. Reference numeral 288 is an $SiO_x$ coating provided on a cleaved end facet. Reference numeral 290 is a $\lambda/4$ shift section.

Figure 30:
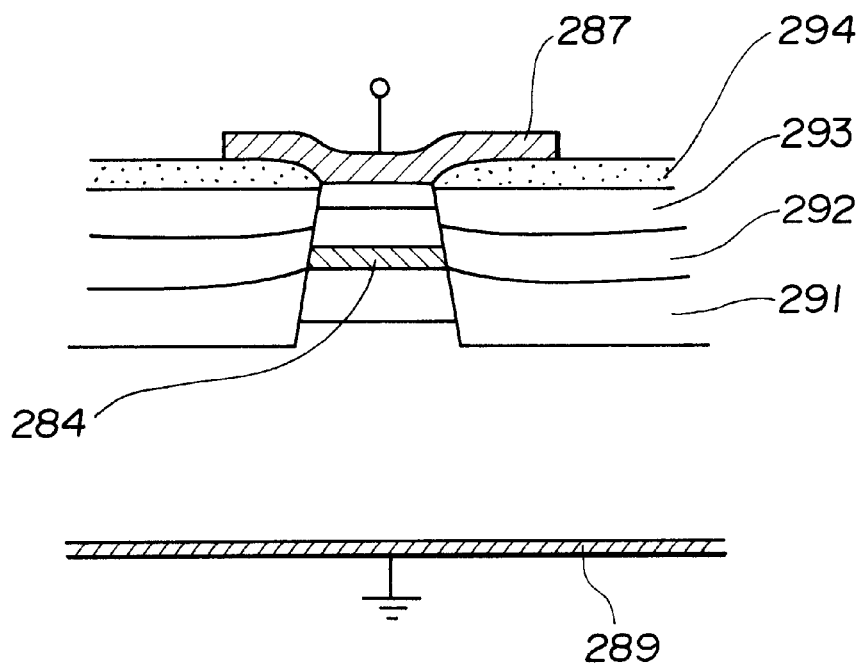
FIG. 30 is a 28B-28B' cross sectional view of FIG. 28.

FIG. 29 illustrates a longitudinal cross section of the laser, but the laser naturally has a lateral light confinement structure, as described above. The lateral light confinement structure can be attained by the same manner as the fourth embodiment. FIG. 30 illustrates a lateral cross section of the laser, and in this case a burying heterostructure (BH) is used. In FIG. 30, InP layers 291, 292 and 293 are layered to form a pnp structure in which the central n-type InP layer 292 is brought into contact with the active layer 284 such that ineffective current leaking can be reduced. Reference numeral 294 is an $SiO_2$ layer formed as a separating insulating layer. FIGS. 29 and 30 show the cross sections of the DFB region 272b, but cross sections of another DFB region 272a are basically the same with the exception that pitch and depth of the grating 282 in the DFB region 272a are different. In this connection, the fourth embodiment should be referred to. Further, active layers in the two DFB regions 272a and 272b and the optical amplifier portion 274 may be different from each other.

The operation of the ninth embodiment will be described. In the DFB regions 272a and 272b, the grating pitches $\Lambda_1$ and $\Lambda_2$ are set such that oscillations in TE and TM mode are respectively dominant at peak wavelengths of gain spectra of TE and TM modes (these wavelengths correspond to the Bragg wavelengths for TE and TM modes of the DFB regions 272a and 272b) when appropriate currents are injected into the DFB regions 272a and 272b. The manners of current injection into the the DFB regions 272a and 272b and setting of the gratings in the DFB regions 272a and 272b, and modal gains of TE and TM modes of the active layer 284 are substantially the same as those of the fouth embodiment (see, for example, FIG. 11). Further, the device of the ninth embodiment can be fabricated by essentially the same process as the fourth embodiment.

In the optical amplifier portion 274 of the ninth embodiment, gains and phases of the respective polarization modes are controlled to vary phase and threshold gain in the compound resonator mode. Thus, the oscillation in a desired polarization mode (TE or TM mode) is caused. Specifically, in the compound resonator laser of FIG. 28, predetermined DC bias currents are injected into the DFB regions 272a and 272b such that TE and TM modes are respectively prevailing in the DFB regions 272a and 272b. Those bias currents are below thresholds in the respective modes. A bias current or an applied voltage in the output optical amplifier portion 274 is then slightly modulated, so that the oscillation polarization mode of the compound resonator mode can be switched between TE and TM modes.

Figure 31:
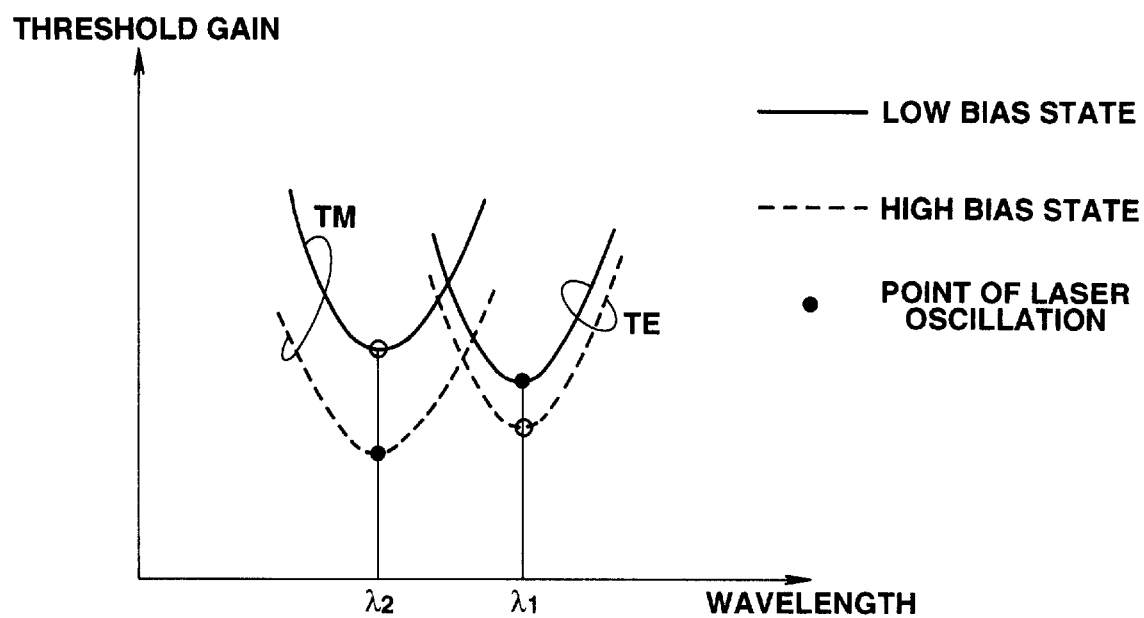
FIG. 31 is a graph of threshold gains of TE and TM modes in different current injection states of the sixth embodiment.

FIG. 31 schematically illustrates threshold gains of TE and TM modes in different bias states of the optical amplifier portion 274. The Bragg wavelengths of TE and TM modes are respectively indicated by $\lambda_1$ and $\lambda_2$. By changing the bias of the optical amplifier portion 274, the TE mode oscillation occurs when the bias is low (solid lines) and the TM mode oscillation occurs when the bias is high (dotted lines). Here, the following current injection characteristics of the active layer 284 are utilized. The gain at a longer wavelength side (TE mode) is saturated and the gain at a shorter wavelength side (TM mode) increases, when the current injection surpasses a predetermined level.

Other than such a gain adjusting method, the oscillation can be controlled between TE and TM modes by selectively adjusting phases of TE and TM modes to achieve the matching of the round trip phase of the resonator. A change of only about several mA in the bias of the optical amplifier portion 274 will suffice to control the oscillation mode between TE and TM modes. Also in this embodiment, a large extinction ratio can be achieved and the device can be operated with little chirping.

Tenth Embodiment

Figure 32:
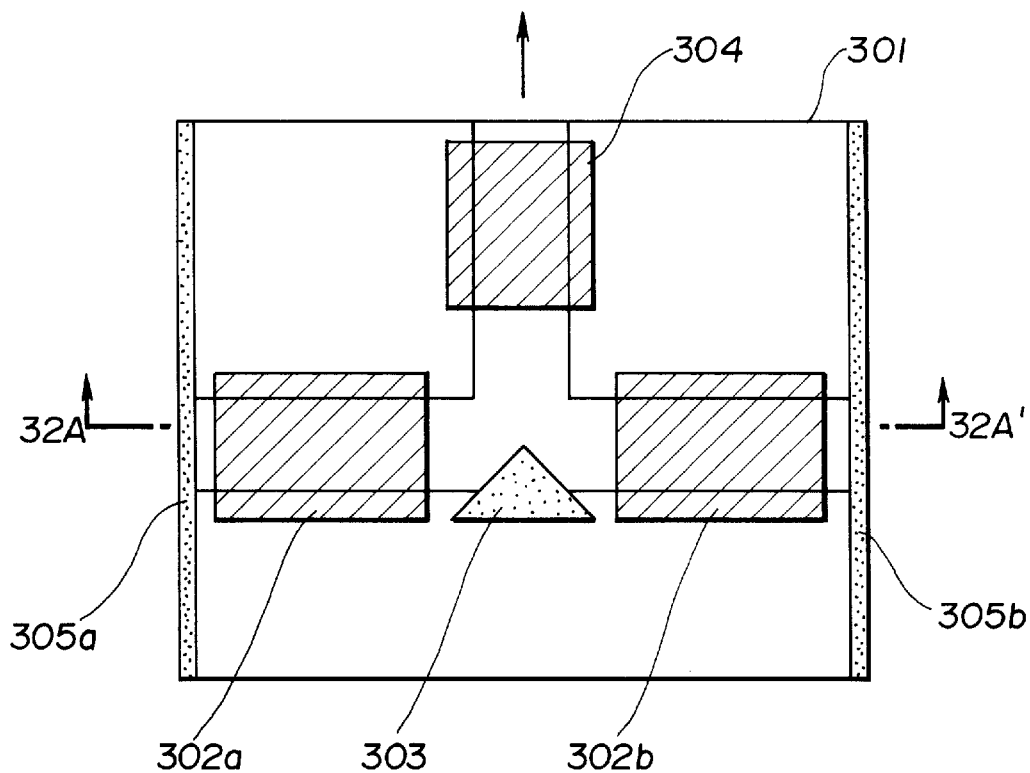
FIG. 32 is a plan view illustrating a tenth embodiment of a semiconductor laser constructed in accordance with this invention.
Figure 33:
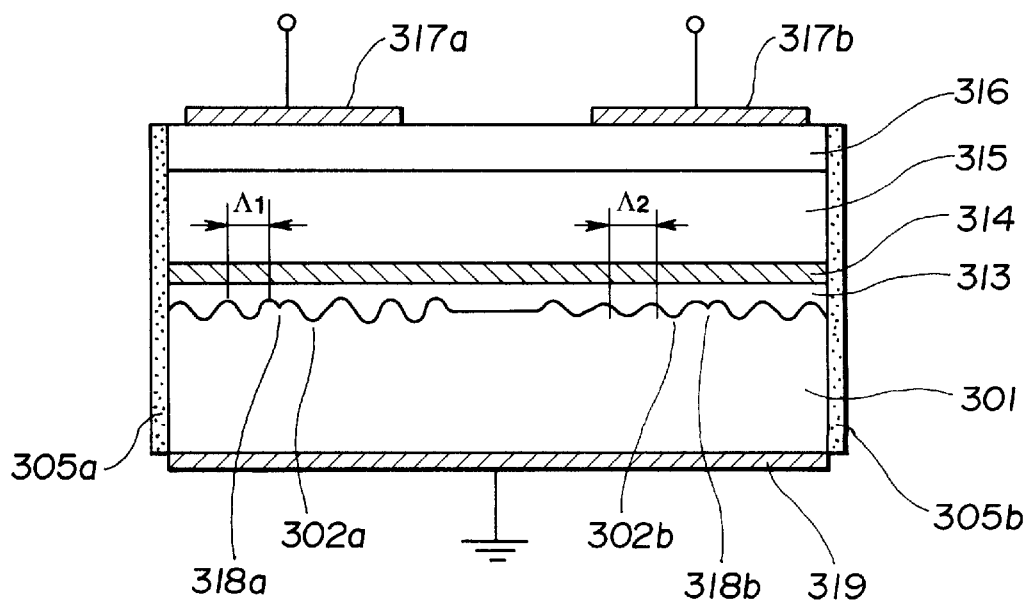
FIG. 33 is a 32A-32A' cross sectional view of FIG. 32.

A tenth embodiment of the present invention will be described with reference to FIGS. 32 and 33. FIG. 32 is a plan view of a device of this embodiment. In FIG. 32, reference numeral 301 is an InP substrate. Reference numerals 302a and 302b are DFB regions in which grating pitches and gains are adjusted such that TE and TM modes are respectively dominant. Reference numeral 305a and 305b are $SiN_x$ AR coatings for suppressing reflection at the end facets. Reference numeral 304 is an optical amplifier region for adjusting gain and phase. A T-shaped waveguide structure is constructed, and a branching and combining device 303, which comprises a wedge-shaped etched mirror, is formed at a connection portion. A compound resonator mode is induced due to an optical wave coupling between the two DFB regions 302a and 302b and the optical amplifier region 304. Similar to the ninth embodiment, the bias current injected into or voltage applied to the optical amplifier region 304 is varied such that the oscillation mode is switched between TE and TM modes. The branching and combining device 303 is a so-called wave front splitter type coupler in which a slit horizontally extends to a central portion of the waveguide and vertically extends down below the waveguide. Such a coupler can be formed by dry etching techniques, such as FIB and RIBE.

When the T-type coupler 303 is used as in this embodiment, the device design relating to the mode competition can be readily performed, compared with the ninth embodiment, since the coupling between the two DFB regions 302a and 302b occurs in a direct manner.

The layer structure of this embodiment will be described. FIG. 33 is a cross section of FIG. 32 taken along 32A-32A'. The two DFB regions 302a and 302b respectively contain $\lambda/4$ shift sections 318a and 318b, and the pitches of gratings 302a and 302b are determined such that the Bragg wavelengths fall at gain peaks of TE and TM modes, respectively. Further, the depths of the gratings 302a and 302b are set at appropriate values to adjust coupling coefficients for TE and TM modes. Other layers 301, 313, 314, 315 and 316 are the same as those of the ninth embodiment. In the tenth embodiment, the depths of the gratings 302a and 302b are made different from each other, as a means for adjusting the coupling coefficients of the gratings 302a and 302b. In FIG. 33, reference numerals 317a , 317b and 319 are electrodes.

Eleventh Embodiment

Figure 34:
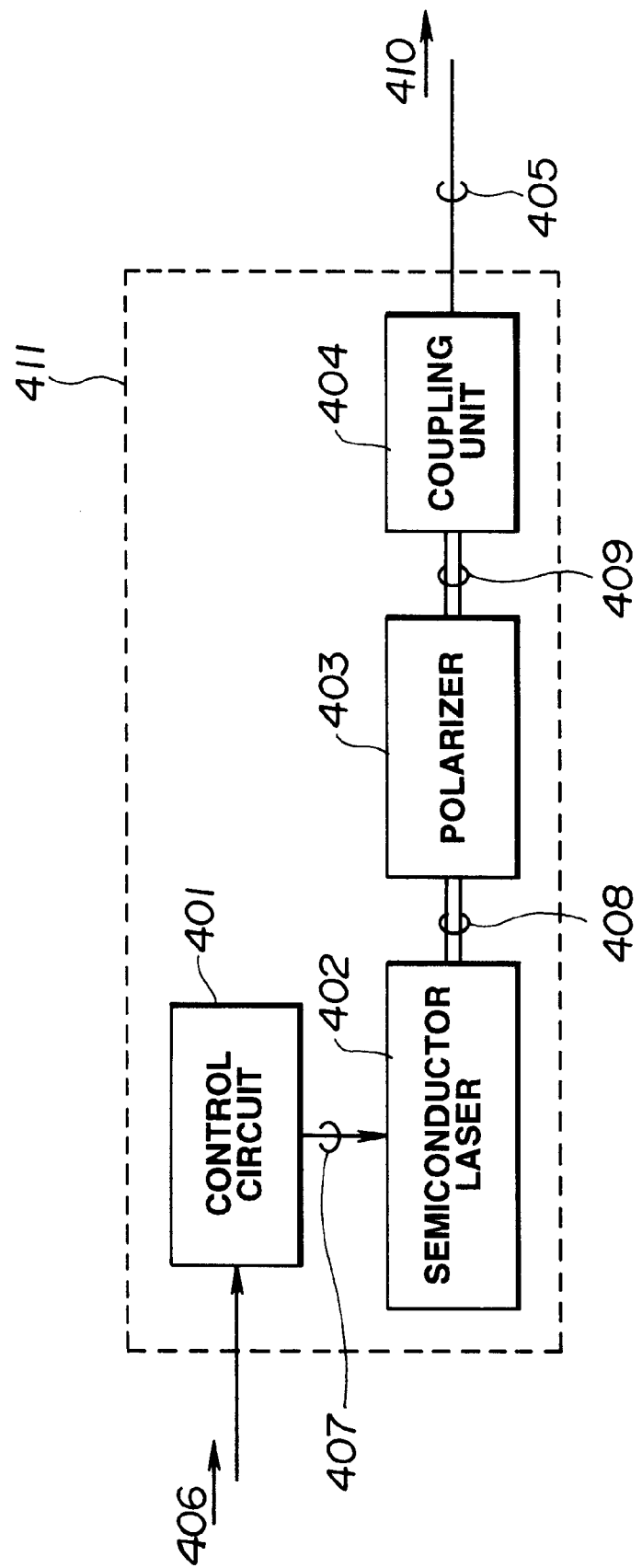
FIG. 34 is a block diagram illustrating an embodiment of an optical transmitter which includes a semiconductor laser constructed in accordance with this invention.

In FIG. 34, an embodiment of a light transmitter including a semiconductor laser of this invention is illustrated. In FIG.

34, reference numeral 401 is a control circuit. Reference numeral 402 is a semiconductor laser constructed in accordance with this invention. Reference numeral 403 is a polarizer. Reference numeral 404 is an optical coupling means for coupling light transmitted in space to an optical fiber 405. Reference numeral 406 is an electric signal supplied from a terminal. Reference numeral 407 is a driving signal or signals supplied from the control circuit 401 to drive the semiconductor laser 402. Reference numeral 408 is a light signal output of the semiconductor laser 402 which is driven by the driving signal 407. Reference numeral 409 is a light signal from the polarizer 403 which is adjusted in the polarizer such that one of two components of the optical signal 408 having mutually perpendicular polarization modes can be selected. Reference numeral 410 is an optical signal transmitted through the optical fiber 405. Reference numeral 411 is a light transmitter which uses the semiconductor laser 402 of this invention. In this embodiment, the transmitter 411 includes the control circuit 401, the semiconductor laser 402, the polarizer 403, the optical coupling means 404, the optical fiber 405 and the like.

The transmission operation of the light transmitter 411 of this embodiment will be described. When the electric signal 406 is supplied to the control circuit 401 from the terminal, the driving signal or signals 407 are supplied to the semiconductor laser 402 according to the modulation method as illustrated in FIGS. 5A and 5B, FIGS. 6A and 6B, FIG. 12, or FIG. 20. Here, the modulation signal can be added to a constant bias by using a superposing circuit, such as a bias T. The semiconductor laser 402 outputs the light signal 408 whose polarization state varies according to the driving signal 407. The light signal 408 is converted by the polarizer 403 to the light signal 409 in one of the two polarization modes, and coupled to the optical fiber 405 by the optical coupling unit 404. The thus-intensity-modulated light signal 410 is transmitted for communication.

In this case, since the light signal 410 is intensity-modulated, a conventional light receiver for intensity-modulation can be used to receive the light signal 410. When a tunable semiconductor laser as described in, for example, second or third embodiment is used, the light transmitter 411 can be employed in wavelength division multiplexing communications. In this case, a wavelength filter may be placed before a photodetector on the side of a receiver. In this embodiment, the apparatus is constructed as a light transmitter, but the apparatus can be used as a transmitter portion in a light transceiver.

The use of the thus-constructed transmitter is not limited to simple optical communication in which the communication is performed between two points. In other words, this transmitter can be used in any optical communication system that employs intensity-modulated signals, such as optical cable television (CATV) and optical local area networks (LAN) of any topology type (i.e., a bus type, a star type, a loop type and so forth).

Figure 35:
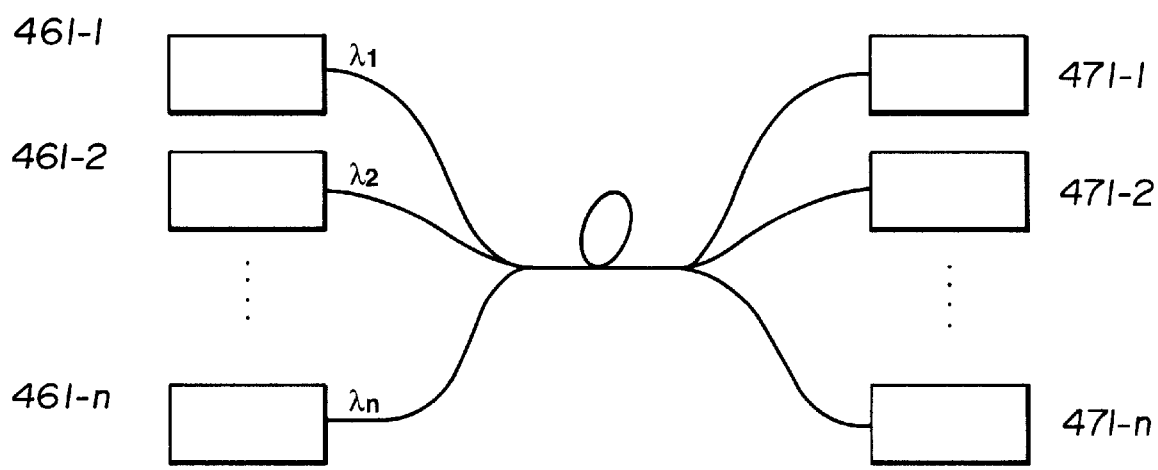
FIG. 35 is a block diagram illustrating an embodiment of a wavelength division wavelength multiplexing optical transmission system which uses a semiconductor laser constructed in accordance with this invention.

FIG. 35 illustrates a star type wavelength division multiplexing communication system in which a semiconductor optical device according to the invention is used. In FIG. 35, reference numerals 461-2 through 461-n are transmitters which respectively include oscillation polarization mode selective lasers and polarizers, and reference numerals 471-1 through 471-n are receivers which respectively include wavelength filters and and photodetectors.

The output wavelength of the mode selective laser can be changed by controlling the current bias injected thereinto. This may be performed in the same manner as in an ordinary DFB-LD. In this embodiment, the wavelength multiplicity is ten (n=10) that is achieved by the transmitters 461-2 through 461-n whose output wavelengths are arranged with intervals of 1 Å. As the wavelength filter of the receiver 471, a DFB type waveguide filter is used. The DFB filters are constructed corresponding to the wavelength multiplicity, and have FWHWs (full-width at half maximum) of less than 0.5 Å. Thus, an optical signal of a desired wavelength can be selectively received at the receiver 471.

According to a first configuration of a semiconductor laser of the present invention (see, for example, FIGS. 1, 2 and 3), a resonator contains an active region formed by two or more active layers having different gain spectra. In at least one of the active layers which is constructed by, for example, a strained quantum well structure, a gain for light in TM mode is larger than a gain for light in TE mode, while in at least another one of the active layers, a gain for light in TE mode is larger than a gain for light in TM mode. Currents can be independently injected into the respective active layers. As a result, when the oscillation in either of the polarization modes occurs, the effective current can be reduced. Further, even when the quantum well structure is used in the active layer, the polarization mode modulation or switching can be conducted in a wider wavelength range than a prior art device.

According to a second configuration of a semiconductor laser of the present invention (see, for example, FIGS. 9 and 10), a resonator includes two or more different DFB regions. In the DFB regions, grating pitches and active layer structures are set such that TE and TM modes are respectively dominant. Thus, the polarization mode modulation or switching can be conducted with good reproducibility. Specifically, when the active layer is formed by the quantum well structure, the competition between oscillations in TE and TM modes can be controlled by coincidence of the transition wavelengths of different quantum levels, which create extremal values of spectra of TE and TM modes, with the Bragg wavelengths for TE and TM modes in the respective DFB regions.

According to a third configuration of a semiconductor laser of the present invention (see, for example, FIGS. 28, 29 and 30), a compound resonator type laser includes two or more different DFB regions which are arranged in parallel, a coupler portion for coupling the DFB regions and an ouput waveguide for emitting light. In the DFB regions, grating pitches and active layer structures are set such that TE and TM modes are respectively dominant. Thus, the competition between oscillations in TE and TM modes can readily occur, and a stable polarization mode selective laser can be obtained. Since the DFB laser regions are separated from each other, each region can be readily made optimum and the device can be fabricated with a good yield. Further, a high degree of freedom in designing can be obtained, so that an optical device having a high performance can be provided.

Except as otherwise disclosed herein, the various components shown in outline or block form in the Figures are individually well known in the optical semiconductor device and optical communication arts, and their internal construction and operation are not critical either to the making or using of this invention or to a description of the best mode of the invention.

While the present invention has been described with respect to what are presently considered to be the preferred embodiments, it is to be understood that the invention is not limited to the disclosed embodiments. The present invention is intended to cover various modifications and equivalent arrangements included within the sprit and scope of the appended claims.

What is claimed is:

1. An oscillation polarization mode selective semiconductor laser for selectively performing one of plural oscillations in different polarization modes, said laser comprising:

a substrate;

a first laser region on said substrate having a semiconductor laser structure in which a gain for light in one of the different polarization modes is dominant;

a second laser region on said substrate having a semiconductor laser structure in which a gain for light in another of the different polarization modes is dominant;

coupling means for coupling the first laser region and the second laser region;

injecting means for independently injecting currents into the first laser region and the second laser region; and selecting means including a third region, other than said first and second laser regions, and means for imparting one of a current and a voltage to said third region, wherein polarization modes of an emitted light of said oscillation polarization selective semiconductor laser is selected by said one of the current and the voltage which is imparted to said third region, wherein said first and second laser regions are arranged parallel to each other along a direction perpendicular to a resonance direction of said semiconductor laser, and wherein said coupling means comprises a Y-type coupler.

2. An oscillation polarization mode selective semiconductor laser for selectively performing one of plural oscillations in different polarization modes, said laser comprising:

a substrate;

a first laser region on said substrate having a semiconductor laser structure in which a gain for light in one of the different polarization modes is dominant;

a second laser region on said substrate having a semiconductor laser structure in which a gain for light in another of the different polarization modes is dominant;

coupling means for coupling the first laser region and the second laser region;

injecting means for independently injecting currents into the first laser region and the second laser region; and selecting means including a third region, other than said first and second laser regions, and means for imparting one of a current and a voltage to said third region, wherein polarization modes of an emitted light of said oscillation polarization selective semiconductor laser is selected by said one of the current and the voltage which is imparted to said third region, wherein said first and second laser regions are arranged parallel to each other along a direction perpendicular to a resonance direction of said semiconductor laser, and wherein said coupling means comprises a T-type coupler.

3. An oscillation polarization mode selective semiconductor laser according to claim 1 or 2, wherein said injecting means comprises electrodes separately formed on said first and second laser regions, respectively.

4. An oscillation polarization mode selective semiconductor laser according to claim 1 or 2, wherein one of the first laser region and the second laser region comprises an active layer into which a compressive strain is introduced.

5. An oscillation polarization mode selective semiconductor laser according to claim 1 or 2, wherein said selecting means comprises an output waveguide portion, said first and second laser regions are arranged parallel to each other, and a light wave coupled by said coupling means is emitted through said output waveguide portion.

6. An oscillation polarization mode selective semiconductor laser according to claim 5, wherein an electrode is formed on said output waveguide portion for one of current injection and voltage application.

7. A driving method for driving an oscillation polarization mode selective semiconductor laser for selectively performing one of plural oscillations in different polarization modes, the laser being for selectively performing one of plural oscillations in different polarization modes, and the laser comprising a substrate, a first laser region on the substrate having a semiconductor laser structure in which a gain for light in one of the different polarization modes is dominant, a second laser region on the substrate having a semiconductor laser structure in which a gain for light in another of the different polarization modes is dominant, coupling means for coupling the first laser region and the second laser region, injecting means for independently injecting currents into the first laser region and the second laser region, and selecting means including a third region, other than the first and second laser regions, and means for imparting one of a current and a voltage to the third region, wherein polarization modes of emitted light of the oscillation polarization selective semiconductor laser is selected by the one of the current and the voltage which is imparted to the third region, wherein the first and second laser regions are arranged parallel to each other along a direction perpendicular to a resonance direction of the semiconductor laser, and wherein the coupling means comprises a Y-type coupler, said driving method comprising:

a step of injecting currents into the first and the second laser regions; and a step of modulating the one of said current and voltage imparted to the third region to modulate the oscillation polarization mode of the semiconductor laser.

8. A driving method for driving an oscillation polarization mode selective semiconductor laser for selectively performing one of plural oscillations in different polarization modes, the laser being for selectively performing one of plural oscillations in different polarization modes, and the laser comprising a substrate, a first laser region on the substrate having a semiconductor laser structure in which a gain for light in one of the different polarization modes is dominant, a second laser region on the substrate having a semiconductor laser structure in which a gain for light in another of the different polarization modes is dominant, coupling means for coupling the first laser region and the second laser region, injecting means for independently injecting currents into the first laser region and the second laser region, and selecting means including a third region, other than the first and second laser regions, and means for imparting one of a current and a voltage to the third region, wherein polarization modes of an emitted light of the oscillation polarization selective semiconductor laser is selected by the one of the current and the voltage which is imparted to the third region, wherein the first and second laser regions are arranged parallel to each other along a direction perpendicular to a resonance direction of the semiconductor laser, and wherein the coupling means comprises a T-type coupler, said driving method comprising:

a step of injecting currents into the first and the second laser regions; and a step of modulating the one of the current and the voltage imparted to the third region to modulate the oscillation polarization mode of the semiconductor laser.

9. A light transmitter comprising:
an oscillation polarization mode selective semiconductor laser for selectively performing one of plural oscillations in different polarization modes, said laser comprising:
a substrate;
a first laser region on said substrate having a semiconductor laser structure in which a gain for light in one of the different polarization modes is dominant;
a second laser region on said substrate having a semiconductor laser structure in which a gain for light in another of the different polarization modes is dominant;
coupling means for coupling the first laser region and the second laser region;
injecting means for independently injecting currents into the first laser region and the second laser region; and
selecting means including a third region, other than said first and second laser regions, and means for imparting one of a current and a voltage to said third region,
wherein polarization modes of emitted light of said oscillation polarization selective semiconductor laser is selected by said one of the current and the voltage which is imparted to said third region,
wherein said first and second laser regions are arranged parallel to each other along a direction perpendicular to a resonance direction of said semiconductor laser, and
wherein said coupling means comprises a Y-type coupler.

10. A light transmitter comprising:
an oscillation polarization mode selective semiconductor laser for selectively performing one of plural oscillations in different polarization modes, said laser comprising:
a substrate;
a first laser region on said substrate having a semiconductor laser structure in which a gain for light in one of the different polarization modes is dominant;
a second laser region on said substrate having a semiconductor laser structure in which a gain for light in another of the different polarization modes is dominant;
coupling means for coupling the first laser region and the second laser region;
injecting means for independently injecting currents into the first laser region and the second laser region; and
selecting means including a third region, other than said first and second laser regions, and means for imparting one of a current and a voltage to said third region,
wherein polarization modes of emitted light of said oscillation polarization selective semiconductor laser is selected by said one of the current and the voltage which is imparted to said third region,
wherein said first and second laser regions are arranged parallel to each other along a direction perpendicular to a resonance direction of said semiconductor laser, and
wherein said coupling means comprises a T-type coupler.

11. An optical communication system comprising:
(a) a light transmitter, said light transmitter including:
an oscillation polarization mode selective semiconductor laser for selectively performing one of plural oscillations in different polarization modes, said laser comprising:
a substrate;
a first laser region on said substrate having a semiconductor laser structure in which a gain for light in one of the different polarization modes is dominant;
a second laser region on said substrate having a semiconductor laser structure in which a gain for light in another of the different polarization modes is dominant;
coupling means for coupling the first laser region and the second laser region;
injecting means for independently injecting currents into the first laser region and the second laser region; and
selecting means including a third region, other than said first and second laser regions, and means for imparting one of a current and a voltage to said third region,
wherein polarization modes of emitted light of said oscillation polarization selective semiconductor laser is selected by said one of the current and the voltage which is imparted to said third region,
wherein said first and second laser regions are arranged parallel to each other along a direction perpendicular to a resonance direction of said semiconductor laser, and
wherein said coupling means comprises a Y-type coupler;
(b) transmission means for transmitting the light selected by said polarization mode selecting means; and
(c) a receiver for receiving the light transmitted by said transmission means.

12. An optical communication system comprising:
(a) a light transmitter, said light transmitter including:
an oscillation polarization mode selective semiconductor laser for selectively performing one of plural oscillations in different polarization modes, said laser comprising:
a substrate;
a first laser region on said substrate having a semiconductor laser structure in which a gain for light in one of the different polarization modes is dominant;
a second laser region on said substrate having a semiconductor laser structure in which a gain for light in another of the different polarization modes is dominant;
coupling means for coupling the first laser region and the second laser region;
injecting means for independently injecting currents into the first laser region and the second laser region; and
selecting means including a third region, other than said first and second laser regions, and means for imparting one of a current and a voltage to said third region,
wherein polarization modes of emitted light of said oscillation polarization selective semiconductor laser is selected by said one of the current and the voltage which is imparted to said third region,
wherein said first and second laser regions are arranged parallel to each other along a direction perpendicular to a resonance direction of said semiconductor laser, and
wherein said coupling means comprises a T-type coupler;
(b) transmission means for transmitting the light selected by said polarization mode selecting means; and
(c) a receiver for receiving the light transmitted by said transmission means.

13. An optical communication system according to claim 11 or 12, wherein said system is constructed as a wavelength division multiplexing communication system.

* * * * *